United States Patent
Jeong et al.

(10) Patent No.: US 11,227,761 B2
(45) Date of Patent: Jan. 18, 2022

(54) METHOD OF REMOVING CHEMICALS FROM A SUBSTRATE

(71) Applicant: SAMSUNG ELECTRONICS CO., LTD., Suwon-si (KR)

(72) Inventors: Ji-Hoon Jeong, Suwon-si (KR); Jung-Min Oh, Incheon (KR); Kun-Tack Lee, Suwon-si (KR); Hyo-San Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/881,113

(22) Filed: May 22, 2020

(65) Prior Publication Data

US 2020/0286727 A1 Sep. 10, 2020

Related U.S. Application Data

(63) Continuation of application No. 16/133,789, filed on Sep. 18, 2018, now Pat. No. 10,679,843, which is a
(Continued)

(30) Foreign Application Priority Data

Jul. 8, 2015 (KR) ........................ 10-2015-0097391

(51) Int. Cl.
*H01L 21/02* (2006.01)
*H01L 21/67* (2006.01)

(52) U.S. Cl.
CPC .. *H01L 21/02041* (2013.01); *H01L 21/02057* (2013.01); *H01L 21/02101* (2013.01); *H01L 21/67017* (2013.01)

(58) Field of Classification Search
None
See application file for complete search history.

(56) References Cited

U.S. PATENT DOCUMENTS

| 6,039,074 A | 3/2000 | Raaijmakers et al. |
| 6,500,605 B1 | 12/2002 | Mullee et al. |

(Continued)

FOREIGN PATENT DOCUMENTS

| KR | 10-0744145 B1 | 8/2007 |
| KR | 10-2007-0113096 A | 11/2007 |

(Continued)

*Primary Examiner* — Eric W Golightly
(74) *Attorney, Agent, or Firm* — Lee IP Law, P.C.

(57) ABSTRACT

A method of processing substrates, comprising: loading a substrate into a process chamber; supplying a supercritical fluid, that is a process fluid under the supercritical state, into the process chamber, chemicals separated from the substrate and the supercritical fluid being mixed into a supercritical mixture in the process chamber; and gradually decreasing a chemical concentration of the supercritical mixture by alternately repeating a pressure drop mode and a supplemental mode such that the supercritical mixture partially flows out from the process chamber at the pressure drop mode when an inner pressure of the process chamber reaches a first pressure and the supercritical fluid turbulently flows into the process chamber at the supplemental mode when the inner pressure of the process chamber reaches a second pressure that is smaller than the first pressure and over a supercritical pressure of the process fluid.

9 Claims, 13 Drawing Sheets

Related U.S. Application Data continuation of application No. 15/069,994, filed on Mar. 15, 2016, now Pat. No. 10,083,829.

(56) References Cited

U.S. PATENT DOCUMENTS

| | | |
|---|---|---|
| 2006/0185693 A1 | 8/2006 | Brown et al. |
| 2007/0000519 A1 | 1/2007 | Jacobson et al. |
| 2007/0164641 A1 | 7/2007 | Pelrine et al. |
| 2007/0293054 A1 | 12/2007 | Lee et al. |
| 2008/0029159 A1 | 2/2008 | Lee et al. |
| 2012/0152898 A1 | 6/2012 | Cho et al. |
| 2013/0000140 A1 | 1/2013 | Jung et al. |
| 2013/0145640 A1 | 6/2013 | Lee et al. |
| 2013/0199051 A1 | 8/2013 | Oh et al. |
| 2013/0199637 A1 | 8/2013 | Kiesbauer |
| 2013/0269732 A1 | 10/2013 | Banerjee et al. |
| 2013/0333726 A1 | 12/2013 | Goshi et al. |
| 2014/0262024 A1 | 9/2014 | Cho et al. |
| 2014/0291421 A1 | 10/2014 | Kim et al. |
| 2014/0299934 A1 | 10/2014 | Kim et al. |
| 2014/0360041 A1 | 12/2014 | Jeong et al. |

FOREIGN PATENT DOCUMENTS

| | | |
|---|---|---|
| KR | 10-2008-0043748 A | 5/2008 |
| KR | 10-2008-0062186 A | 7/2008 |
| KR | 10-2012-0067403 A | 6/2012 |
| KR | 10-2013-0025138 A | 3/2013 |
| KR | 10-2013-0063813 A | 6/2013 |
| KR | 10-2013-0091550 A | 8/2013 |
| KR | 10-2014-0090421 A | 7/2014 |
| KR | 10-2014-0112638 A | 9/2014 |
| KR | 10-2014-0117758 A | 10/2014 |
| KR | 10-2014-0122096 A | 10/2014 |
| KR | 10-2014-0144806 A | 12/2014 |

METHOD OF REMOVING CHEMICALS FROM A SUBSTRATE

CROSS-REFERENCE TO RELATED APPLICATIONS

This application is a continuation of U.S. Ser. No. 16/133,789, filed Sep. 18, 2018 now U.S. Pat. No. 10,679,843, issued Jun. 9, 2020, which is a continuation of U.S. Ser. No. 15/069,994, filed Mar. 15, 2016, now U.S. Pat. No. 10,083,829 B2, issued Sep. 25, 2018, the entire contents of both being hereby incorporated by reference.

Korean Patent Application No. 10-2015-0097391, filed on Jul. 8, 2015, in the Korean Intellectual Property Office, and entitled: "Apparatus for Treating Substrates Using Supercritical Fluids, Substrate Treatment System Including the Same and Method of Treating Substrates Using the Same," is incorporated by reference herein in its entirety.

BACKGROUND

1. Field

Example embodiments relate to an apparatus and a system for treating substrates and a method of treating substrates using the same.

2. Description of the Related Art

A wet process for semiconductor devices such as a wet cleaning process and a wet etching process may require a drying process for drying off chemicals for the wet processes. However, fine patterns on a substrate may collapse or lean, and may make contact with a neighboring pattern (known as a bridge defect) in the drying process, as the design rule of semiconductor devices may be reduced.

SUMMARY

Embodiments may be realized by providing an apparatus for treating substrates, the apparatus including a process chamber to treat the substrates using a supercritical fluid; a supply module to supply the supercritical fluid into the process chamber, the supply module having an inlet valve through which the supercritical fluid flows into the process chamber until an inner pressure of the process chamber reaches a first pressure and a turbulent flow generator to turbulently supplement the supercritical fluid into the process chamber until the inner pressure of the process chamber is recovered to the first pressure; a pressure drop module to drop the inner pressure of the process chamber to a second pressure below the first pressure by partially removing a supercritical mixture of the supercritical fluid and chemicals that separated from the substrate from the process chamber until the inner pressure of the process chamber is dropped to the second pressure from the first pressure; and a flow controller alternately repeating a pressure drop mode and a supplemental mode, the supercritical mixture partially flowing out from the process chamber when the inner pressure reaches the first pressure by the pressure drop module in the pressure drop mode, and the supercritical fluid turbulently flowing into the process chamber by the turbulent flow generator when the inner pressure reaches the second pressure in the supplemental mode.

The supply module may include a supercritical reservoir to store the supercritical fluid; and a supercritical supplier to supply the supercritical fluid to the process chamber, the supercritical supplier having the inlet valve and a supercritical line at which the inlet valve and the turbulent flow generator are arranged.

The supercritical line may include an upper line to connect with an upper portion of the process chamber such that the supercritical fluid is supplied to the upper portion of the process chamber and a lower line to connect with a lower portion of the process chamber such that the supercritical fluid is supplied to the lower portion of the process chamber, and the inlet valve may include an upper valve on the upper line and a lower valve on the lower line.

The turbulent flow generator may include a pneumatic control valve on a branch line of the upper line, the turbulent flow generator to supplement the supercritical fluid into the process chamber at a mass flow greater than the upper valve complementary with the upper valve.

The supercritical fluid reservoir may include a storing cylinder having a built-in heater, a detecting sensor to detect a temperature and a pressure of the storing cylinder, and a power supplier to apply an electrical power to the built-in heater.

The supply module may include a source reservoir to store a process fluid; a source purifier connected to the source reservoir, the source purifier to remove impurities from the process fluid; a source condenser to condense the process fluid to a liquid; a first source line between the source reservoir and the source condenser, the source purifier being installed to the first source line; a second source line between the source condenser and the supercritical fluid reservoir; and a transfer pump installed to the second source line.

The source purifier may include a pair of cleaning cylinders having a high efficiency particulate air filter and a carbon filter that are operated complementary with each other.

The pressure drop module may include a back pressure regulator through which the supercritical mixture of the chemicals and the supercritical fluid is partially removed from the process chamber until the inner pressure of the process chamber is dropped to the second pressure.

The back pressure regulator may include an actuator operated in response to the inner pressure of the process chamber, a diaphragm combined to the actuator, and an on-off valve operated by the actuator in such a way that the on-off valve is open at the first pressure and is closed at the second pressure.

The flow controller may include a pressure sensor to detect the inner pressure of the process chamber as a detected pressure; a concentration sensor to detect a concentration of the chemicals in the supercritical mixture as a detected concentration; a first controller to control the supply module in response to the detected pressure of the pressure sensor and the detected concentration of the concentration sensor; and a second controller to control the pressure drop module in response to the detected pressure and the detected concentration.

The flow controller may include a central controller to control the first and the second controllers such that the pressure drop mode and the supplemental mode are alternately repeated when the detected concentration is higher than a reference concentration, the drop mode being conducted by activating the pressure drop module while inactivating the turbulent flow generator via the first and the second controllers and the supplemental mode being conducted by activating the turbulent flow generator while inactivating the pressure drop module via the first and the second controllers.

The central controller may include a turbulent counter to count the activation number of the supplemental mode such that the repetition of the supplemental mode and the pressure drop mode is compulsorily terminated when the detected activation number of the supplemental mode corresponds to a preset activation number.

The apparatus may further include a discharging module to discharge the supercritical mixture from process chamber such that the inner pressure is dropped down step by step from the second pressure to an atmospheric pressure and the supercritical fluid in the supercritical mixture is gradually transformed into the process fluid step by step to thereby obtain a process mixture of the process fluid and the chemicals. The flow controller may include a third controller that controls the discharging module to discharge the supercritical mixture from the process chamber when the detected concentration is smaller than the reference concentration.

The discharging module may include at least one outlet line connected to the process chamber and a plurality of outlet valves on the outlet line such that each of the discharge valves has a respective mass flow and the inner pressure of the process chamber reduces down to the atmospheric pressure from the second pressure step by step via at least an intermediate pressure under a supercritical pressure of the process fluid.

The outlet valves may include a first valve through which the supercritical mixture is discharged from the process chamber at a first discharging mass flow such that the inner pressure of the process chamber reduces down to the intermediate pressure from the second pressure and a second valve through which the process mixture is discharged from the process chamber at a second discharging mass flow greater than the first mass flow such that the inner pressure of the process chamber reduces down to the atmospheric pressure from the intermediate pressure, the first and the second valves being operated complementary with each other.

The first valve may include a pneumatic control valve of which the mass flow is controlled by an air pressure and the second valve may include an on-off valve by which no mass flow is controlled.

The apparatus may further include a recycling module connected to the discharging module, the recycling module to separate the process fluid from the process mixture, the separated process fluid being transferred into the supply module to thereby recycle the process fluid.

The recycling module may include a separator to separate the process fluid from the process mixture to thereby obtain a separated fluid, a purifier to remove impurities from the separated fluid to thereby obtain a recycling fluid, a recycling condenser to condense the recycling fluid, and a recycling reservoir to contain the recycling fluid.

The separator may include a first separator to remove the chemicals from the process mixture, the first separator to remain the process fluid by a phase difference change to thereby obtain the separated fluid; and a second separator to heat the separated fluid to thereby remove residuals of the chemicals from the separated fluid.

The second separator may include a cylindrical body, a distiller in the cylindrical body, the distiller to remove residual chemicals from the separated fluid, and a heater to heat the distiller.

Embodiments may be realized by providing a method of treating substrates, the method including loading a substrate into a process chamber; supplying a supercritical fluid into the process chamber until an inner pressure of the process chamber reaches a first pressure, chemicals separated from the substrate and the supercritical fluid being mixed into a supercritical mixture in the process chamber; and gradually decreasing a concentration of the chemicals in the supercritical mixture through alternately repeating a pressure drop mode and a supplemental mode such that the supercritical mixture partially flows out from the process chamber at the pressure drop mode when the inner pressure reaches the first pressure and the supercritical fluid turbulently flows into the process chamber at the supplemental mode when the inner pressure reaches a second pressure under the first pressure and above a supercritical pressure of a process fluid.

Supplying the supercritical fluid into the process chamber may include supplying the supercritical fluid into a lower portion of the process chamber at a second mass flow through a lower line; and supplying the supercritical fluid into an upper portion of the process chamber at a first mass flow through an upper line until the inner pressure of the process chamber reaches the first pressure.

The first and the second mass flows may be in a range of 50 g/min to 400 g/min.

The first mass flow may be in a range of 200 g/min to 400 g/min and the second mass flow may be in a range of 50 g/min to 200 g/min.

Gradually decreasing the concentration of the chemicals in the supercritical mixture may include conducting the pressure drop mode until the inner pressure reaches the second pressure; conducting the supplemental mode until the inner pressure is recovered to the first pressure; detecting the concentration of the chemicals in the supercritical mixture to thereby obtain a detected concentration of the chemicals in the process chamber; and alternately repeating the pressure drop mode and the supplemental mode until the detected concentration of the chemicals is smaller than a reference concentration of the chemicals.

The first pressure may be in a range of 80 bar to 180 bar and the second pressure may be in a range of 80 bar to 100 bar while the reference concentration may be in a range of 1 wt % to 3 wt %.

The supercritical fluid may turbulently flow into the process chamber at a mass flow of 800 g/min to 1200 g/min in the supplemental mode.

The method may further include removing the supercritical mixture from the process chamber step by step when the detected concentration is smaller than the reference concentration.

Removing the supercritical mixture from the process chamber may include discharging the supercritical mixture from the process chamber at a first discharging mass flow such that the inner pressure of the process chamber reduces down from the second pressure to an intermediate pressure under a supercritical pressure of the process fluid and the supercritical fluid is changed into the process fluid under the supercritical pressure, to thereby form a process mixture in which the process fluid is mixed with the chemicals; and discharging the process mixture from the process chamber at a second discharging mass flow greater than the first discharging mass flow such that the inner pressure of the process chamber reduces down to an atmospheric pressure from the intermediate pressure.

The first discharging mass flow may be in a range of 40 g/min to 150 g/min and the intermediate pressure may be in a range of 60 bar to 80 bar.

Embodiments may be realized by providing a substrate treatment system, including a load port to which a substrate carrier is positioned, the substrate carrier holding a plurality of substrates to be treated; a plurality of treating apparatuses in which at least one of the substrates is treated; and a transfer extracting the substrate from the carrier and loading the substrate into one of the treating apparatuses, at least one of the treating apparatuses being the presently disclosed apparatus.

The treating apparatuses may include a wet etching apparatus, a cleaning apparatus and a dry apparatus that are individually connected with the transfer and the substrate is sequentially treated in an order named the wet etching apparatus, the cleaning apparatus and the dry apparatus.

Embodiments may be realized by providing a method of treating substrates, the method including loading a substrate into a process chamber; supplying a supercritical fluid into the process chamber until an inner pressure of the process chamber reaches a first pressure, the supercritical fluid and chemicals separated from the substrate being mixed into a supercritical mixture in the process chamber; and preventing ice particles from forming by gradually discharging the supercritical mixture from the process chamber step by step through a plurality of outlet valves having different mass flows by alternately repeating: partially flowing the supercritical mixture out from the process chamber when the inner pressure reaches the first pressure until the inner pressure reaches the second pressure; and turbulently flowing the supercritical fluid into the process chamber when the inner pressure reaches a second pressure under the first pressure and above a supercritical pressure of a process fluid until the inner pressure is recovered to the first pressure.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
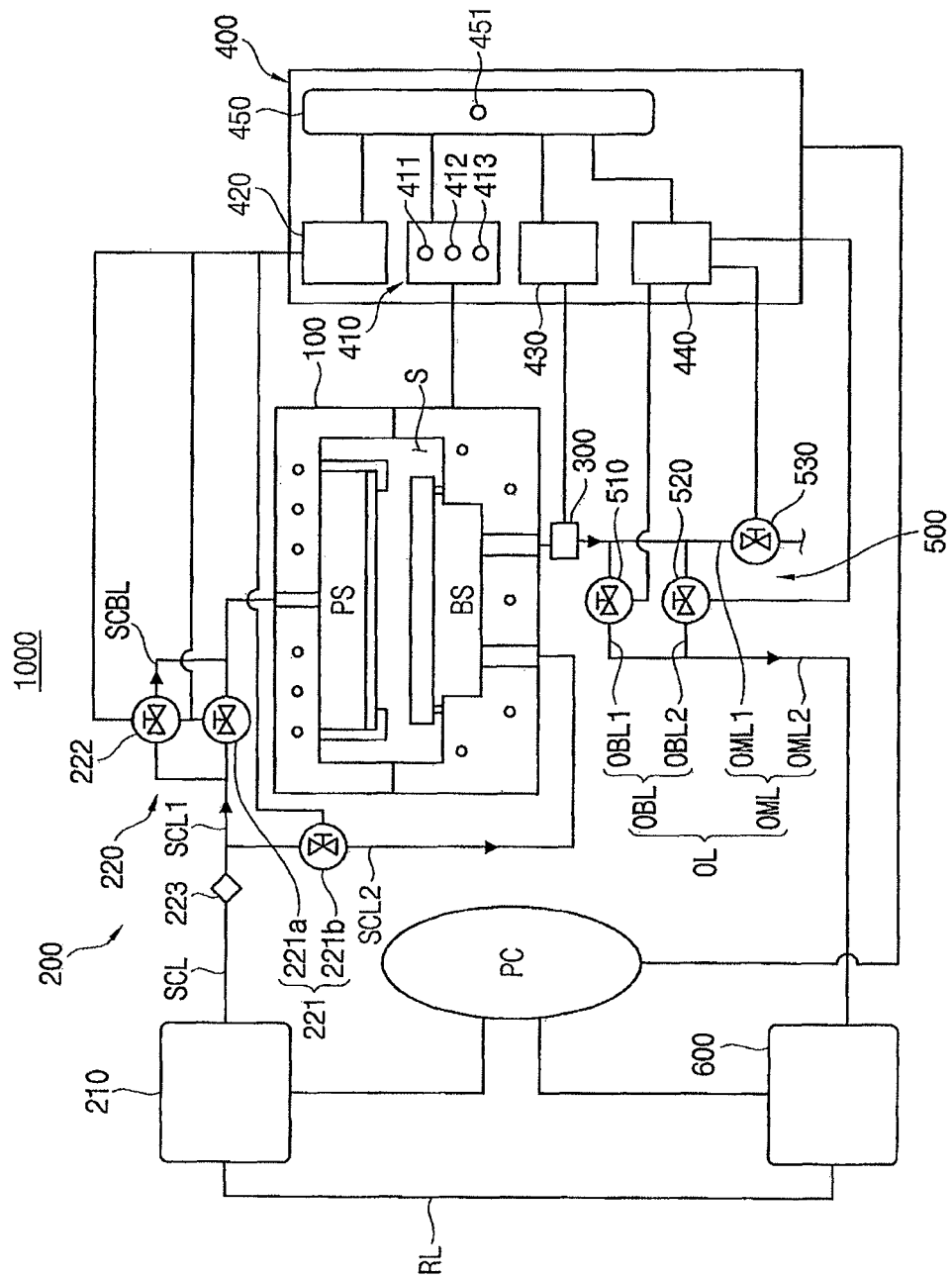
FIG. 1 illustrates a structural view of an apparatus for treating substrates in accordance with an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the thicknesses of layers and regions may be exaggerated for clarity. It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

FIG. 1 illustrates a structural view of an apparatus for treating substrates in accordance with an example embodiment.

Referring to FIG. 1, the apparatus 1000 for treating substrates (hereinafter, referred to as substrate treating apparatus) may include a process chamber 100 configured to treat the substrates W using a supercritical fluid that is a process fluid in a supercritical state, a supply module 200 configured to supply the supercritical fluid into the process chamber 100, a pressure drop module 300 configured to drop the inner pressure of the process chamber 100 to a second pressure below the first pressure, a flow controller 400, a discharging module 500 discharging a supercritical mixture of the supercritical fluid and chemicals from the process chamber 100 and a recycling module 600 separating the process fluid from a process mixture and recycling the process fluid.

In example embodiments, the process chamber 100 may have an inner space S in which the substrate W may be processed. For example, the process chamber 100 may have a sufficient rigidity and sealing for maintaining the supercritical state in the inner space S.

Figure 2:
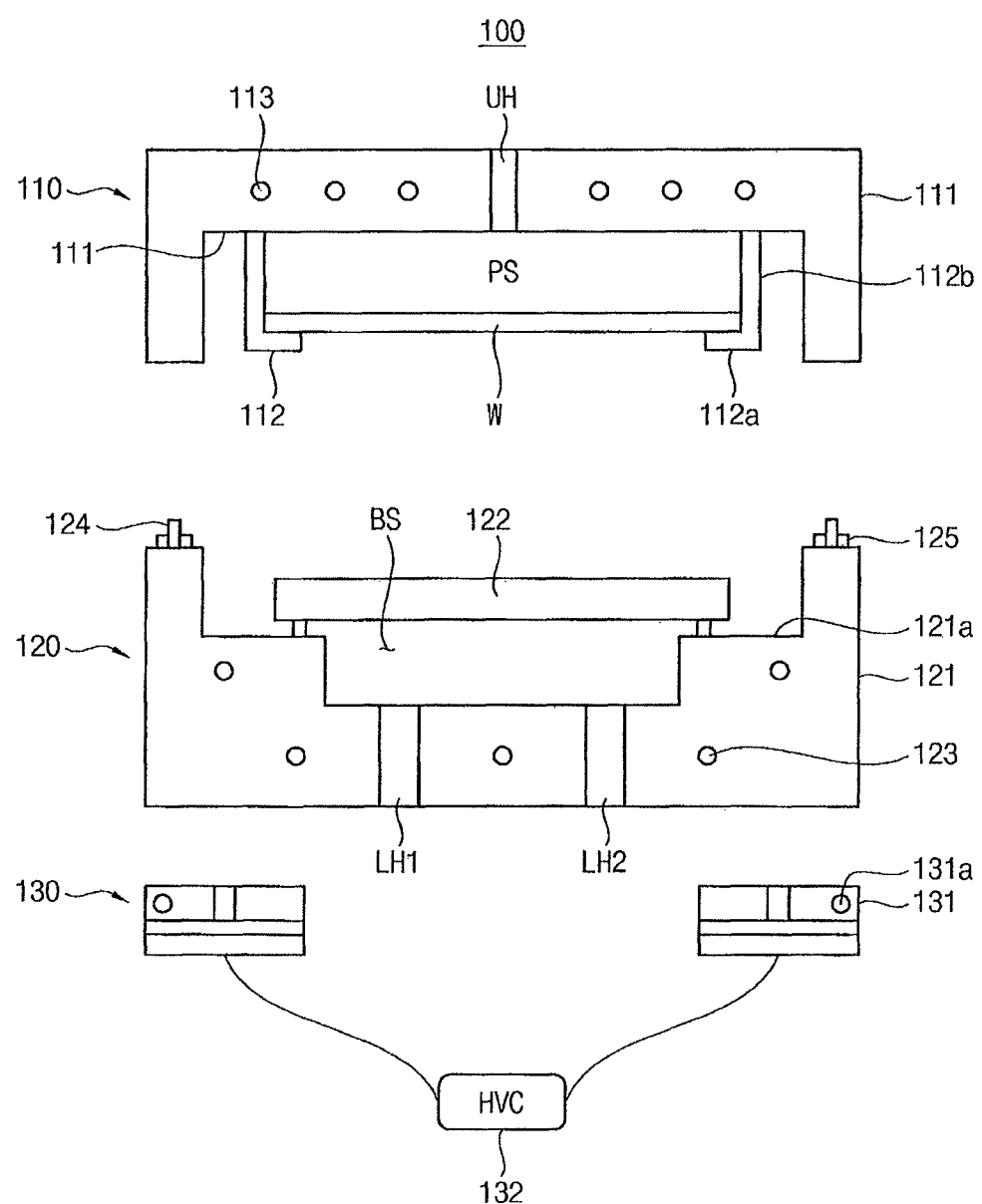
FIG. 2 illustrates a structural view of the process chamber in the substrate treating apparatus shown FIG. 1.

FIG. 2 illustrates a structural view of the process chamber in the substrate treating apparatus shown FIG. 1.

Referring to FIGS. 1 and 2, the process chamber 100 may include an upper chamber 110 having a substrate holder 112, a lower chamber 120 having a blocking plate 122 and a buffer space BS between the blocking plate 122 and a lower portion thereof and a chamber driver 130 combining the upper chamber 110 and the lower chamber 120 in such a way that the insides of the upper chamber 110 and the lower chamber 120 is formed to the sealed inner space S of the process chamber 100.

The upper chamber 110 may include an upper body 111 that may be shaped into a three-dimensional recessed solid and be secured to a preset position and the substrate holder 112 that may be arranged at a top portion thereof. The substrate holder 112 may include a horizontal bar 112a on which the substrate W may be positioned and a vertical bar 112b extending upwards from the horizontal bar 112a and secured to a ceiling 111a of the upper body 111. The substrate holder 112 may move upwards and downwards in a vertical direction. The substrate W may be hold by the substrate holder 112 in such a way that a rear surface of the substrate W may make contact with the horizontal bar 112a and a side surface of the substrate W may make contact with the vertical bar 112b.

In the present example embodiment, the substrate holder 112 may include a resin having a sufficiently small compressive strain, and the deformation of the substrate holder 112 may be minimized in the supercritical fluid. For example, the substrate holder 112 may include a fluoride-based resin such as polyether ether ketone (PEEK) and polyimide (PI), and the substrate W may be stably located at a correct position in the process chamber 100 under the supercritical state.

An upper hole UH may be provided with the upper portion of the upper chamber 110 and an upper path line, which will be described in detail hereinafter, may be connected to the upper hole UH. A plurality of upper heaters 113 may be provided with the upper body 111, and the upper chamber 110 may be heated by the upper heaters 113.

The lower chamber 120 may be driven to move upwards and downwards by the chamber driver 130, and the lower chamber 120 may be detachably combined to the upper chamber 110.

The lower chamber 120 may include a lower body 121 that may be shaped into a three-dimensional recessed solid having a further recessed portion as the buffer space BS and the blocking plate 122 covering the buffer space BS. The upper chamber 110 and the lower chamber 120 may be combined with each other, the assembly of the upper and lower chambers 110 and 120 may be provided as the process chamber 100, and the recessed portion inside the chambers 110 and 120 may be provided as the inner space S of the process chamber 100.

In the present example embodiment, the buffer space BS may be provided in a bottom recess having a depth of about 10 mm to about 50 mm from a bottom surface 121a of the lower body 121 and a diameter of about 30 mm to about 150 mm. The blocking plate 122 may be shaped into a disk plate that may be spaced apart from the bottom surface 121a and may cover the buffer space BS. For example, the blocking plate 122 may have a diameter of about 50 mm to about 250 mm, and the size of the buffer space BS may be varied as long as the buffer space BS may be sufficiently covered with the blocking plate 122.

A pair of first and second lower holes LH1 and LH2 may be provided with the lower body 121 in such a configuration that the buffer space BS may be communicated with the lower holes LH1 and LH2. As described in detail hereinafter, the supercritical fluid may be supplied into the buffer space BS through the first lower hole LH1 and the supercritical mixture and byproducts of the process may be discharged from the process chamber 100 through the second lower hole LH2. A lower path line may be connected to the first lower hole LH1 and a discharge line may be connected to the second lower hole LH2.

A plurality of lower heaters 123 may be provided with the lower body 121, and the lower chamber 120 may be heated by the lower heaters 123. A plurality of joints 124 may be protruded from a peripheral portion of the lower body 121 and may be inserted into a joint hole of the upper body 111, and the upper body 111 and the lower body 121 may be combined to each other by the joints 124.

The supercritical fluid may be directly supplied to the substrate W, and the substrate W and the fine patterns on the substrate W may be damaged by the supercritical fluid. The supercritical fluid may be blocked by the blocking plate 122, and the substrate W may be prevented from the direct injection of the supercritical fluid. The flow path of the supercritical fluid may be changed from a vertical direction to a horizontal direction by the blocking plate 122, and may horizontally flow into the inner space S of the process chamber 100 via a gap space between the bottom surface 121*a* and the blocking plate 122. The substrate W may be sufficiently protected from the direct injection of the supercritical fluid. Although ice particles may be generated in the buffer space BS due to, for example, the adiabatic expansion of the supercritical fluid at an initial time when the supercritical fluid may be supplied into the buffer space BS, the ice particles may be settled down in the buffer space BS and may be prevented from being deposited onto the substrate W in the inner space S of the process chamber 100. Thus, the substrate W may be sufficiently prevented, e.g., protected, from the ice particles at the initial time of the process.

The chamber driver 130 may be connected to the lower chamber 120 and may drive the lower chamber 120 to combine with the upper chamber 110 or to separate from the upper chamber 110.

For example, the chamber driver 130 may include a hydraulic cylinder 131 that may be connected to the lower body 121 and may transfer hydraulic pressure to the lower chamber 110 upwards or downwards and a hydraulic controller 132 for controlling the hydraulic pressure of the hydraulic cylinder 131.

The number of the hydraulic cylinder 131 may be varied according to the shape and structure of the lower chamber 120. The chamber driver 130 may further include a level sensor 131*a* that may detect a level degree of the lower chamber 120 when the lower chamber 120 may move upwards and downwards by the chamber driver 130.

The level sensor 131*a* may include one of a floating level sensor, an ultrasonic level sensor, a capacitive level sensor and a vibrating level sensor. The hydraulic controller 132 may include a hydraulic valve assembly.

The lower chamber 120 may move upwards and may be combined to the upper chamber 110 by the chamber driver 130, the process chamber 100 may be assembled, and the supercritical fluid, a process fluid in a supercritical state, may be supplied into the process chamber 100 until the inner pressure of the process chamber 100 may reach a first pressure higher than a supercritical pressure of the process fluid.

The upper chamber 110 and the lower chamber 120 may include a rigid material having a sufficient rigidity and stiffness against the first pressure and the chamber driver 130 may combine the upper chamber 110 and the lower chamber 120 with a sufficient force for sealing the inner space S from surroundings in spite of the first pressure in the process chamber 100.

For example, a sealing member 125 may be provided around the joint 124 at the boundary area between the upper chamber 110 and the lower chamber 120, and the inner space S of the process chamber 100 may be sufficiently separated from the surroundings. For example, a groove may be provided on a rear surface of the upper chamber 110 and a top surface of the lower chamber 120 and an O-ring may be inserted into the groove as the sealing member 125.

For example, the sealing member 125 may include polymers such as polytetra fluoro ethylene (PTFE), perfluoro alkoxy (PFA), polyimide, polyethylene, polychloro trifluoro ethylene (PCTFE), urethane and fluoride-based resin. These may be used alone or in combinations thereof.

In the present example embodiment, the process chamber may include stainless steel having an allowable pressure of about 300 bar and an allowable temperature of about 150° C. and the chamber driver 130 may combine the lower chamber 120 to the upper chamber 110 by a compressive force over about 300 bar.

The process in the process chamber under the supercritical state (hereinafter, referred to as supercritical process) may include various unit process for manufacturing semiconductor devices. For example, the supercritical process may include a wet etching process using the supercritical fluid as an etchant, a cleaning process using the supercritical fluid as a cleaning solution and a dry process, e.g., a drying process, using the supercritical fluid as a dry solvent. Thus, the process fluid that may be changed into the supercritical fluid by the phase change may be selected according to the process in the process chamber 100.

For example, the substrate W may include fine patterns having a high aspect ratio of about 10 to about 50 and may undergo the cleaning process using organic chemicals before the substrate W may be loaded into the process chamber 100, and a drying process using the supercritical fluid may be performed to the substrate W in the process chamber 100 without substantial damage to the high aspect ratio patterns.

The supercritical fluid may be supplied into the process chamber 100 together with various additives such as a surfactant and the chemicals or impurities may be separated from the substrate W by a solvent substitution with the supercritical fluid. The substrate W may be sufficiently treated in the supercritical process without damage to the high aspect ratio patterns on the substrate W. The process fluid may be changed into the supercritical fluid when the process fluid may be under a temperature and pressure above the critical point thereof. The supercritical fluid may diffuse through solids like a gas and may dissolve materials like a liquid. The process fluid for the supercritical fluid may be varied according to the chemicals or the impurities that may be separated from the substrate W.

For examples, the organic chemicals may include ethyl glycol, propanol, tetra hydraulic franc, 4-hydroxyl, 4-methyl, 2-pentanone, 1-butanol, 2-butanol, methanol, ethanol, n-propyl alcohol, dimethylether and combinations thereof. The process fluid for removing the organic chemicals from the substrate W may include carbon dioxide ($CO_2$), pure water ($H_2O$), methane ($CH_4$), ethane ($C_2H_6$), propane ($C_3H_8$), ethylene ($C_2H_4$), propylene ($C_2H_2$), methanol ($C_2H_3OH$), ethanol ($C_2H_5OH$), sulfur hexafluoride ($SF_6$), acetone ($C_3H_8O$) and combinations thereof.

In example embodiments, the supply module 200 may supply to the process chamber 100 until the inner pressure of the process chamber 100 may reach the first pressure above the supercritical pressure while the inner temperature of the process chamber 100 may be preset above the supercritical temperature, and the supercritical state may be set in the process chamber 100. In the supercritical state, the chemicals may be dissolved into the supercritical fluid from the substrate W through the solvent substitution, and a supercritical mixture, in which the chemicals may be mixed with the supercritical fluid, may be formed. The supercritical mixture may be discharged from the process chamber 100 by the pressure drop module 300 and the discharge module 500.

The supercritical mixture may be partially extracted or removed from the process chamber 100 by the pressure drop module 300 until the inner pressure of the process chamber 100 may be dropped to a second pressure from the first pressure (pressure drop mode), and may be partially supplemented into the process chamber 100 by the supply module 200 until the inner pressure of the process chamber 100 may be recovered to the first pressure (supplemental mode).

The supply module 200 and the pressure drop module 300 may be controlled by the flow controller 400 in such a way that the pressure drop module and the supplemental mode may be alternately repeated until the chemical concentration of the supercritical mixture may be detected to be smaller than a reference concentration. The chemical concentration may be smaller than the reference concentration, and the supercritical mixture may be discharged from the process chamber 100.

For example, the flow controller 400 may control the supply module 300 to supplement the supercritical fluid into the process chamber 100 at a relatively large mass flow, and the supercritical fluid may be supplied into the process chamber 100 as a turbulent flow until the inner pressure of the process chamber is recovered or increase again to the first pressure from the second pressure. The substitution rate of the solvent substitution with the supercritical fluid may be rapidly increased, and the process efficiency in the substrate treating apparatus may be increased using the supercritical fluid.

In an example embodiment, the supply module 200 may include a supercritical reservoir 210 in which the supercritical fluid may be stored and a supercritical supply unit 220 by which the supercritical fluid may be supplied to the process chamber 100.

Figure 3:
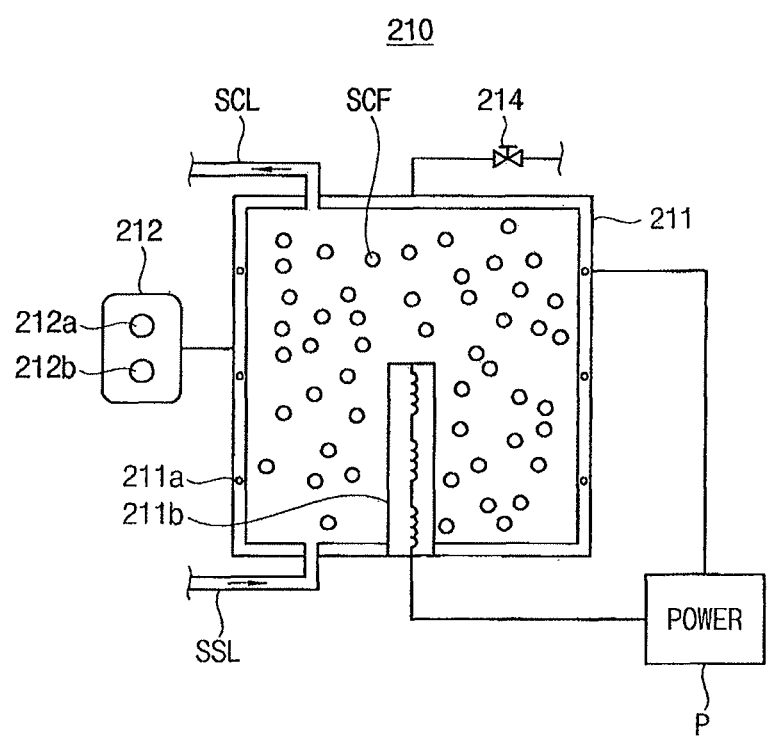
FIG. 3 illustrates a structural view of the supercritical reservoir of the supply module 200 shown in FIG. 1.

FIG. 3 illustrates a structural view of the supercritical reservoir of the supply module 200 shown in FIG. 1.

Referring to FIG. 3, the supercritical reservoir 210 may include a storing cylinder 211 having built-in heaters 211a and 211b, a detecting sensor 212 detecting a temperature and a pressure of the storing cylinder 211 and a power supplier P applying an electrical power to the built-in heater 211a and 211b.

For example, the storing cylinder 211 may include a steel cylinder having a sufficient thickness and rigidity for the supercritical state and a volume of about 10 L to about 50 L. The first built-in heater 211a may be provided in the storing cylinder 211 and the second built-in heater 211b may be protruded into a space of the storing cylinder 211 from a bottom thereof. The first and the second built-in heater 211a and 211b may be operated by the power supplier P. In the present example embodiment, the storing cylinder 211 may include a stainless steel that may be sufficiently endure under the allowable temperature of 30° C. to about 300° C. and the allowable pressure of about 70 bar to about 300 bar.

The process fluid may be supplied to the storing cylinder 211 via the source supply line SSL to a pressure above the supercritical pressure of the process fluid and then may be heated to a temperature above the supercritical temperature by the built-in heaters 211a and 211b, and the process fluid may be changed into the supercritical fluid SCF in the storing cylinder 211. The temperature and the pressure of the storing cylinder 211 may be detected by the detecting sensor 212 having a temperature sensor 212a and a pressure sensor 212b, and the supercritical state may be maintained in the storing cylinder 211. The pressure of the storing cylinder 211 may become higher than the allowable pressure, the relief valve 214 may be automatically operated, supercritical fluid may be discharged from the storing cylinder 211, and the pressure of the storing cylinder 211 may be reduced.

The supercritical fluid SCF in the storing cylinder 211 may be supplied to the process chamber 100 by the supercritical supply unit 220 having a supercritical line SCL that may be connected to the process chamber 100.

The supercritical supply unit 220 may include an inlet valve 221 for controlling the initial supply of the supercritical fluid SCF until the inner pressure of the process chamber 100 may reach the first pressure, a turbulent flow generator 222 for turbulently and rapidly supplementing the supercritical fluid into the process chamber 100 until the inner pressure of the process chamber 100 may be recovered to the first pressure after the pressure drop from the first pressure and the supercritical line SCL to which the inlet valve 221 and the turbulent flow generator 222 may be installed.

For example, the supercritical line SCL may include an upper line SCL1 that may be connected with an upper portion of the process chamber 100, the supercritical fluid SCF may be supplied to an upper portion of the process chamber 100 and a lower line SCL2 that may be connected with a lower portion of the process chamber 100, and the supercritical fluid may be supplied to the lower portion of the process chamber. The inlet valve 221 may include an upper valve 221a that may be arranged on the upper line SCL1 and a lower valve 221b that may be arranged on the lower line SCL2.

The inner pressure of the process chamber 100 may be under the supercritical pressure just before the supercritical fluid SCF may be supplied to the process chamber 100, and some of the supercritical fluid SCF may be changed into ice particles due to, for example, the adiabatic expansion just after the supercritical fluid may be supplied into the process chamber 100.

In the present example embodiment, the supercritical fluid SCF may be supplied into the buffer space BS of the lower chamber 120 through the lower line SCL2 at the initial time of the treating process in the process chamber 100 until the pressure gradient in the process chamber 100 may decrease within an allowable range, and then the supercritical fluid SCF may be also supplied through the upper line SCL1 together with the lower line SCL2. The supply time of the supercritical fluid may be sufficiently reduced by the both supply through the upper and lower lines SCL1 and SCL2.

The ice particles may be condensed on sidewalls defining the buffer space BS and may be prevented from being directly deposited onto the substrate W in the inner space S of the process chamber 100, and the substrate W may be sufficiently prevented, e.g., protected, from the ice particles. The blocking plate 122 may prevent the supercritical fluid SCF from being directly injected onto the substrate W, and the high aspect ratio patterns on the substrate W may be sufficiently prevented from collapse due to, for example, the high pressure supercritical fluid.

The pressure gradient between the inner pressure of the process chamber and the pressure of the supercritical fluid may be sufficiently small, and the supercritical fluid SCF may also be directly injected to the substrate W through the upper line SCL1 without substantial collapse of the high aspect the aspect ratio patterns.

The high aspect ratio patterns may be arranged on a front surface of the substrate W and the substrate W may be positioned on the substrate holder 112 such that the rear surface may make contact with the horizontal bar 112a of the substrate holder 112, and the treating process to the substrate W may be performed in a gap space between the ceiling 111a of the upper chamber 110 and the front surface of the substrate W. The gap space between the ceiling 111a of the upper chamber 110 and the front surface of the substrate W may be provided as a process space PS in the process chamber 100.

The supercritical fluid SCF may be supplied just into the buffer space BS through the lower line SCL2 at the initial time of the process, and then may be supplied into both of the buffer space BS and the process space PS through both of the upper line SCL1 and the lower line SCL2 at a time when the pressure gradient may be sufficiently small between the inner pressure of the process chamber 100 and the pressure of the supercritical fluid.

The inlet valve 221 may include a mass control valve for controlling the mass flow through the supercritical line SCL. For example, the inlet valve 221 may include a pressure compensation valve that may control the mass flow according to the inner pressure of the process chamber 100, and when the inner pressure of the process chamber 100 may reach the first pressure, the inlet valve 221 may be automatically closed and the supercritical fluid may stop supplying into the process chamber 100.

For example, the lower valve 221b may control the supercritical fluid to supply into the process chamber 100 at a relatively low mass flow, and the ice particles in the buffer space BS may be prevented, while the upper valve 221a may control the supercritical fluid to supply into the process chamber 100 at a relatively high mass flow, and the supply efficiency of the supercritical fluid to the process chamber 100 may be increased. For example, the lower valve 221b may supply the supercritical fluid at a mass flow of about 50 g/min to about 200 g/min and the upper valve 221a may supply the supercritical fluid at a mass flow of about 200 g/min to about 400 g/min.

In modified example embodiments, various instruments may be further installed to, e.g., installed on, the supercritical line SCL. For example, a supercritical filter 223, a line temperature sensor and a line pressure sensor may be installed to the supercritical line SCL. The supercritical filter 223 may remove impurities or contaminants from the supercritical fluid SCF before the supercritical fluid may be supplied into the process chamber 100, and the purity of the supercritical fluid SCF in the process chamber 100 may be increased. For example, the supercritical filter 223 may include a nano filter for filtering the particles of about 20 nm to about 40 nm.

The line temperature sensor and the line pressure sensor may detect the temperature and pressure of the supercritical fluid SCF in the supercritical line SCL. The temperature and pressure of the supercritical fluid SCF may decrease under supercritical temperature and pressure, respectively, in the supercritical line SCL, and the fluid in the supercritical line SCL may be deviated from the supercritical state and may be controlled to stop supplying into the process chamber 100.

The turbulent flow generator 222 may be installed to the upper line SCL1 and be operated complementary with, e.g., in complement with, the upper valve 221a. For example, the turbulent flow generator 222 may supply the supercritical fluid at a mass flow greater than the upper valve 221a.

For example, a branch line SCBL branching off from the upper line SCL1 may be connected to the process space PS of the upper chamber 110 and the turbulent flow generator 222 may be installed to the branch line SCBL. The flow controller 400 may control the turbulent flow generator 222 and the inlet valve 221 to operate complementary with, e.g., in complement with, each other.

The supercritical fluid may be supplied into the process chamber 100 and the process space PS may be under the supercritical state, the chemicals may be separated from the substrate W by the solvent substitution with the supercritical fluid and the separated chemicals may be dissolved into the supercritical fluid, and a supercritical mixture may be generated.

The inner pressure of the process chamber 100 may reach the first pressure, and the flow controller 400 may control the inlet valve 221 to stop supplying the supercritical fluid and may control the pressure drop module 300 to partially flow out the supercritical mixture from the process chamber 100 until the inner pressure of the process chamber 100 may decrease to a second pressure that may be under the first pressure but still be over the supercritical pressure of the process fluid.

The inner pressure may reduce down to the second pressure in the process chamber 100, and the flow controller 400 may control the turbulent flow generator 222 to turbulently supplement the supercritical fluid into the process chamber 100 until the inner pressure may be recovered or increase again to the first pressure.

For example, the turbulent flow generator 222 may supplement the supercritical fluid at a mass flow greater than the inlet valve 221 in such a way that the supercritical fluid may be supplied into the process chamber 100 in a turbulent flow. The process space PS may be still under the supercritical state, and the solvent substitution may still occur and the chemicals may be separated from the substrate W irrespective of the turbulent flow of the supercritical fluid. The turbulent flow of the supercritical fluid may increase the reaction rate of the solvent substitution, and the process efficiency of the supercritical process in the process chamber 100 may be increased.

The inner pressure may be recovered to the first pressure by the supplemental of the supercritical fluid, and the flow controller 400 may control the turbulent flow generator 222 to stop and then control the pressure drop module 300 to operate again until the inner pressure may reduce again to the second pressure. The supplemental mode for supplementing the supercritical fluid and the pressure drop mode for dropping the pressure by partially extracting the supercritical mixture may be alternately repeated by the flow controller 400. The concentration of the chemicals in the supercritical mixture may rapidly decrease, and the process efficiency of the process chamber 100 may be increased.

In the present example embodiment, the turbulent flow generator 222 may include a pneumatic control valve that may supplement the supercritical fluid into the process chamber 100 at a mass flow greater than the upper valve 221a and may be operated complementary with, e.g., in complement with, the upper valve 221a.

While the present example embodiment discloses the pneumatic control valve as the turbulent flow generator 222, other turbulence generators would be utilized as the turbulent flow generator 222 as long as the turbulence generator may be easily controlled by the flow controller 400.

While the present example embodiment discloses that the branch line SCBL may branch off from the upper line SCL1 so as to facilitate the supply of the supercritical fluid to the process space PS of the upper chamber 110, the branch line SCBL may also branch off from the lower line SCL2 or a side line, and the process space PS may be provided at a lower portion or a side portion of the process chamber 100.

In example embodiments, the supply module 200 may include a source reservoir 230 storing the process fluid and a source supply unit 240 for supplying the process fluid to the supercritical reservoir 210.

Figure 4:
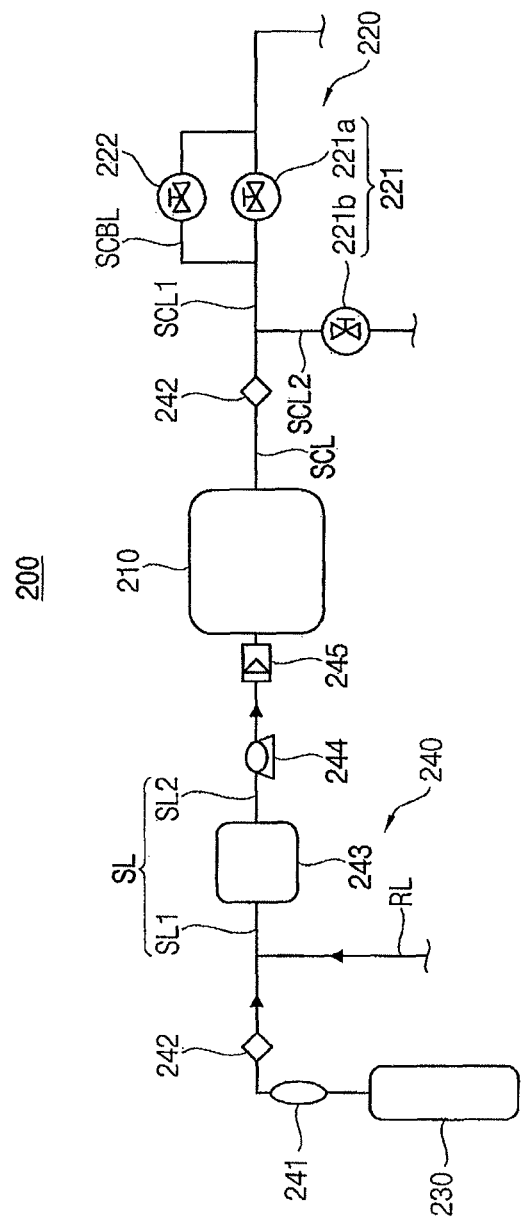
FIG. 4 illustrates a structural view of the source reservoir and the source supplying unit of the supply module shown in FIG. 1.

FIG. 4 illustrates a structural view of the source reservoir and the source supplying unit of the supply module shown in FIG. 1.

Referring to FIG. 4, the source reservoir 230 may include a reservoir cylinder or a reservoir tank having a sufficient rigidity and the process fluid may be stored in the source reservoir 230. In the present example embodiment, the process fluid may be provided as a gaseous state, and the source reservoir 230 may include a gas cylinder having an allowable pressure of about 200 bar to about 550 bar.

The process fluid in the source reservoir 230 may be supplied into the supercritical reservoir 210 through a source line SL.

The source supply unit 240 may include a source purifier 241 that may be connected to the source reservoir 230 and remove impurities from the process fluid, a source filter 242 further filtering residuals of the impurities from the process fluid, a source condenser 243 condensing the process fluid to a liquid, a transfer pump 244 transferring the liquefied process fluid to the supercritical reservoir 210 and a flow detector 245 detecting the mass flow of the liquefied process fluid that may be supplied into the supercritical reservoir 210.

Figure 5:
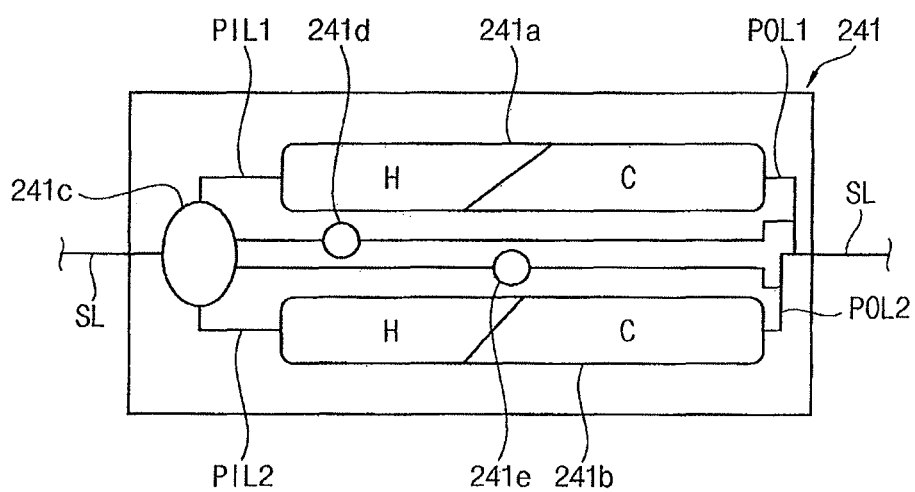
FIG. 5 illustrates a structural view of the source purifier of the source supply unit shown in FIG. 4.

FIG. 5 illustrates a structural view of the source purifier of the source supply unit shown in FIG. 4.

Referring FIG. 5, the source purifier 241 may include a pair of cleaning cylinders 241a and 241b that may be operated complementary with, e.g., in complement with, each other. Each of the cleaning cylinders 241a and 241b may include a high efficiency particulate air (HEPA) filter H and a carbon filter C.

The process fluid may reach the source purifier 241 through source line SL, and a purifier selector 241c may guide the process fluid to one of first and second purifying cylinders 241a and 241b through purifying inlet lines PIL1 and PIL2. For example, the first and second purifying cylinders 241a and 241b may be operated complementary with, e.g., in complement with, each other, and when one of the first and second purifying cylinders 241a and 241b may be broken, the process fluid may still be purified by the rest of the purifying cylinders 241a and 241b, and the purify failures, e.g., purity failures, of the process fluid may be prevented and the maintenance cost of the source purifier 241 may be reduced.

Each of the purifying cylinders 241a and 241b may include both of the HEPA filter and the carbon filter C, and the process fluid may be purified by both of the HEPA filter H and the carbon filter C. The purified process fluid may be discharged from the purifying cylinders 241a and 241b through purifying outlet lines POL1 and POL2 that may be connected again to the source line SL.

For example, each of the purifying outlet lines POL1 and POL2 may be individually connected to a respective contaminant detector 241d or 241e, and the process fluids in the purifying outlet lines POL1 and POL2 may be individually detected by the respective contaminant detector 241d and 241e.

The detected concentration of the contaminants of the process fluid in the first purifying cylinder 241a may be over an allowable range, the purifier selector 241c may change the path of the process fluid from the first purifying inlet line PIL1 to the second purifying inlet line PIL2, and the process fluid may be purified by the second purifying cylinder 241b. Thereafter, a purifying filter of the first purifying cylinder 241a may be replaced with a new filter, and the first purifying cylinder 241a may be repaired without interruption of the flow of the process fluid.

The purity degree of the process fluid may increase about 100 times by the source purifier 241. For example, the process fluid having the purity degree of about 99.9%, which may be widely denoted as a purity unit of 3N, may be purified to the purity degree of about 99.999% or 5N. In the present example embodiment, the source purifier 241 may comprise steel having an allowable pressure over about 200 bar and may remove CxHy-based organic contaminants and moistures from the process fluid.

Residuals of the contaminants may be removed from the process fluid by the source filter 242, and the source filter 242 may be selectively provided with the source supply unit 240 according to the process fluid.

The source condenser 243 may condense the purified process fluid to a liquid state, and the transfer rate of the process fluid to the supercritical reservoir 210 may be increased. For example, the source condenser 243 may cool the process fluid down to a temperature of about −50° C. to about −30° C. by using ethylene glycol as a refrigerant. Liquid materials or liquefied materials may be used as the process fluid, and the source condenser 243 may not be required for the source supply unit 240.

The transfer pump 244 may compel the liquefied process fluid to move into the supercritical reservoir 210. The transfer amount of the liquefied process fluid may be detected and controlled by the flow detector 245. For example, the transfer pump 245 may include a diaphragm pump that may transfer the liquefied process fluid in temperature of about −20° C. to about 150° C. under a pressure of about 100 bar to about 300 bar.

A first source line SL1 may be connected between the source reservoir 230 and the source condenser 243, and the gaseous process fluid may flow through the first source line SL1. A second source line SL2 may be connected between the source condenser 243 and the supercritical reservoir 210, the liquefied process fluid may flow through the second source line SL2, and the source purifier 41 and the source filter 242 may be provided with the first source line SL1 and the transfer pump 244 and the flow detector 245 may be provided with the second source line SL2. Additional instruments for controlling the process fluid may be further provided with the source line SL. For example, a regulator for controlling the mass flow of the process fluid and an additional sensor for detecting the temperature and the pressure of the process fluid may be additionally installed to the source line SL.

In example embodiments, the source line SL may include a single pipe line or a dual pipe line that may comprise a stainless steel and have an allowable pressure of about 200 bar to about 550 bar.

Referring again to FIG. 1, the pressure drop module 300 may include a back pressure regulator (BPR) through which the supercritical mixture of the chemicals and the supercritical fluid may be partially removed from the process chamber 100 until the inner pressure of the process chamber 100 may be dropped to the second pressure.

Figure 6:
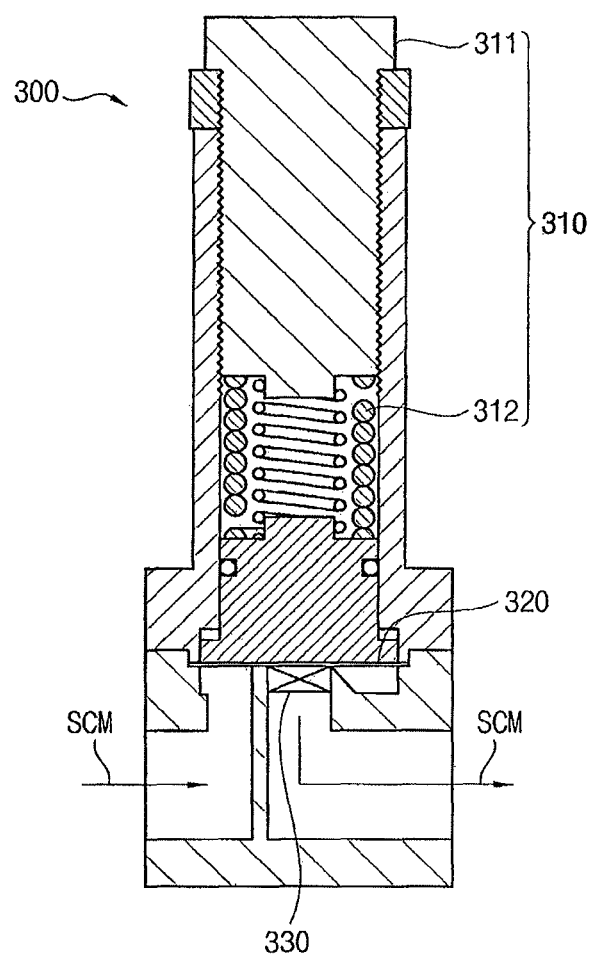
FIG. 6 illustrates a structural view of the pressure drop module of the substrate treating apparatus shown in FIG. 1.

FIG. 6 illustrates a structural view of the pressure drop module of the substrate treating apparatus shown in FIG. 1.

Referring to FIG. 6, the pressure drop module 300 may include an actuator 310 operated in response to the inner pressure of the process chamber 100, a pressure detector 320 combined to the actuator 310 and detecting the inner pressure of the process chamber 100 and an on-off valve 330 operated by the actuator 310 in such a way that the on-off valve is open at the first pressure and is closed at the second pressure.

For example, the actuator 310 may include an actuating member 311 connected to the flow controller 400 and a valve controller 312 operating the on-off valve 330 according to the actuating member 311. In the present example embodiment, the actuating member 311 may include a screw structure that may be connected to a second controller 430 of the flow controller 400 and the valve controller 312 may include a linear spring system.

The pressure detector 320 may include a diaphragm that may directly detect the inner pressure of the process chamber 100 and the spring system of the valve controller 312 may make direct contact with the diaphragm.

The spring system may be preset to be compressed by a compressive force corresponding to the first pressure. The inner pressure of the process chamber 100 may reach the first pressure, the diaphragm of the pressure detector 320 may detect the first pressure and the spring system of the valve controller 312 may be compressed in response to the variation of the diaphragm, and the on-off valve 330 may be open and the supercritical mixture SCM may be partially removed from the process chamber 100. The spring system of the valve controller 312 may be stopped by the second controller 430 until the inner pressure may reach the second pressure, and the supercritical mixture SCM may be still removed from the process chamber 100 until the inner pressure reach the second pressure.

The inner pressure may be dropped to the second pressure in the process chamber 100, the second controller 430 may drive the actuating member 311 to move forward, and the spring system may be restored according to the actuating member 311. The on-off valve 330 may be closed and the removal of the supercritical mixture SCM may be stopped.

The pressure drop module 300 may be repeatedly operated between the first and the second pressures of the process chamber 100, and the supercritical mixture SCM may also be repeatedly and partially removed from the process chamber 100, which may gradually decrease the chemical concentration in the supercritical mixture SCM.

The chemical concentration in the supercritical mixture SCM may be detected below a reference concentration, and the supercritical mixture SCM may be totally discharged from the process chamber 100 until the inner pressure of the process chamber may reach an atmospheric pressure.

While the present example embodiment discloses that the combination of the screw structure and the spring system may be used as the actuator 310 of the pressure drop module 300, various valve controller would be utilized for the actuator 310 as long as the valve controller may be controlled by the second controller 430 of the flow controller 400 and may be sufficiently operated in a real time in response to the first and the second pressures.

Referring again to FIG. 1, the flow controller 400 may control the pressure drop module 300 together with the turbulent flow generator 222, and the reaction rate of the solvent substitution in the process chamber 100 may be increased.

For example, the flow controller 400 may include a chamber detector 410 for detecting process environmental conditions in the process chamber 100, a first controller 420 for controlling the supply of the supercritical fluid into the process chamber 100, a second controller 430 for controlling the partial removal of the supercritical mixture from the process chamber 100 until the inner pressure of the process chamber may reduce to the second pressure, a third controller 440 for the total discharge of the supercritical mixture from the process chamber 100 and a central controller 450 for controlling the chamber detector 410 and the first to third controllers 420 to 440.

The chamber detector 410 may include a pressure sensor 411 for sensing the inner pressure of the process chamber 100, a temperature sensor 412 for sensing the inner temperature of the process chamber 100 and a concentration sensor for sensing the concentration of the chemicals in the supercritical mixture SCM.

The pressure sensor 411 may detect the inner pressure of the process chamber 100 in a real time or at a constant time interval, and the first and the second pressure may be detected by the pressure sensor 411. The temperature sensor 412 may detect the inner temperature of the process chamber 100. For example, the detected pressure and temperature of the process chamber 100 may be displayed on a monitor and the supercritical state in the process chamber 100 may be confirmed by the detected temperature and pressure.

The first and the second pressure may still be over the supercritical pressure of the process fluid, the inner space S of the process chamber 100 may still be under the supercritical state although the inner pressure may decrease to the second pressure from the first pressure, and the supercritical mixture SCM may be generated in the process chamber 100 irrespective of the first and the second pressures.

The supercritical mixture SCM may be partially removed from the process chamber 100 by the pressure drop module 300, and the inner pressure of the process chamber 100 may be dropped in proportion to the removal amount of the supercritical mixture SCM (pressure drop mode). The pressure drop mode may be maintained until the inner pressure may be dropped to the second pressure from the first pressure. The supercritical fluid SCF may be supplemented into the process chamber in a turbulent state by the turbulent flow generator 222, and the inner pressure of the process chamber 100 may increase in proportion to the supplemental amount of the supercritical fluid SFM (supplemental mode). The supplemental mode may be maintained until the inner pressure may be recovered to the first pressure from the second pressure.

The pressure drop module 300 and the pressure drop mode and the supplemental mode may be alternately repeated by the central controller 450 until the detected concentration of the chemicals may be under the reference concentration. The supercritical mixture SCM may be partially removed from the process chamber 100 at the pressure drop mode and the supercritical fluid SCF may be supplemented into the process chamber 100 at the supplemental mode, and the chemical concentration in the process chamber 100 may gradually decrease as the number of repetition of the pressure drop mode and the supplemental mode may increase.

The concentration sensor 413 may detect the concentration of the chemicals in the supercritical mixture SCM and the detected chemical concentration may be transferred to the central controller 450. For example, whenever the pressure drop mode may be terminated, the concentration sensor 413 may detect the chemical concentration from the supercritical mixture that may be removed from the process chamber 100 by the pressure drop module 300. The detected concentration of the chemicals may be compared with the reference concentration of the chemicals in the central controller 450.

The first to third controllers 420 to 440 may be systematically controlled by the central controller 450 based on the detected inner temperature and pressure and the detected chemical concentration.

The solvent substation may occur and the supercritical mixture may be generated from the time when the supercritical state may be initiated in the process chamber 100 and then the supercritical mixture may be continuously generated until the inner pressure may reach the first pressure. The inner pressure may reach the first pressure, the first controller 420 may control the inlet valve 221 and the turbulent flow generator 222 of the supply module 200 to be inactive and the second controller 430 may control the pressure drop module 300 to be active, the supercritical mixture SCM may be partially removed from the process chamber 100, and the inner pressure of the process chamber 100 may be dropped in proportion to the removal amount of the supercritical mixture SCM.

The above pressure drop mode may be conducted until the inner pressure of the process chamber 100 may reduce to the second pressure. The second pressure may still be over the supercritical pressure of the process fluid, and the solvent substitution may still occur during the pressure drop from the first pressure to the second pressure and the supercritical mixture may be continuously generated in the pressure drop mode.

The inner pressure of the process chamber 100 may reach the second pressure, and the first controller 420 may control the inlet valve 221 to be closed and the turbulent flow generator 222 to be open while the second controller 430 may control the pressure drop module 300 to be inactive in such a way that no more supercritical mixture may be removed from the process chamber 100. The supercritical fluid SCF may be supplemented into the process chamber 100 in a turbulent state by the turbulent flow generator 222, and the reactive rate of the solvent substitution may increase due to, for example, the turbulent flow of the supercritical fluid in the process space PS.

The above supplemental mode may be conducted until the inner pressure of the process chamber 100 may be recovered to first pressure. The inner pressure may reach the first pressure again in the process chamber 100, and the pressure drop mode may be conducted again. The pressure drop mode and the supplemental mode may be alternately repeated by the flow controller 400. The chemical concentration may be detected whenever the pressure drop mode may be terminated and then may be compared with the reference concentration. In the present example embodiment, the reference concentration of the chemicals may be in a range of about 1 wt % to about 3 wt % based on the weight of the chemicals. The reference concentration may be varied according to the characteristics of the substrate treating apparatus 1000.

The detected concentration of the chemicals may be under the reference concentration of the chemicals, the discharge module 500 may be operated in place of the turbulent flow generator 222, and the supercritical mixture may be totally discharged from the process chamber 100.

The repetition of the pressure drop mode and the supplemental mode may sufficiently increase the efficiency of the chemical removal from the substrate in the process chamber 100.

In a modified example embodiment, the central controller 450 may include a turbulent counter 451 that may count the activation number of the supplemental mode, i.e., the number of the turbulent flow that may be supplied to the process chamber 100.

The repetition loop of the pressure drop mode and the supplemental mode may be terminated by the comparison of the detected chemical concentration with the reference concentration. Otherwise, the repetition loop of the pressure drop mode and the supplemental mode may also be compulsorily terminated by the activation number of the supplemental mode when the counted activation number of the supplemental mode may correspond to a preset activation number. For example, the turbulent counter 415 may interrupt a driving signal that may be applied to the turbulent flow generator 222 and may obtain the number of the interrupted signals as the activation number of the supplemental mode.

The detected chemical concentration may be under the reference concentration, and the discharge module 500 may totally discharge the supercritical mixture from the process chamber 100 step by step until the inner pressure may reach down to an atmospheric pressure from the second pressure. The supercritical fluid in the supercritical mixture may be changed again to the process fluid at the time when the inner pressure may be reduced down under the supercritical pressure in discharging the supercritical mixture, and the supercritical mixture may also be changed into a process mixture when the inner pressure may be under the supercritical pressure. The discharge module 500 may be controlled by the third controller 440 under the control of the central controller 450.

For example, the discharging module 500 may include at least an outlet line OL that may be connected to the process chamber 100 and a plurality of outlet valves that may be arranged on the outlet line OL. Each of the outlet valves may have a respective mass flow and the inner pressure of the process chamber 100 may reduce down to the atmospheric pressure from the second pressure step by step via at least an intermediate pressure under a supercritical pressure of the process fluid.

The outlet line OL may include first and second outlet main lines OML1 and OML2 and first and second outlet branch lines OBL1 and OBL2 that may branch off from the first outlet main line OML1 and may be connected to the second OML2. The second outlet main line OML2 may be connected to the recycling module 600.

A first outlet valve 510 may be installed to the first outlet main line OML1, and the supercritical mixture may be discharged from the process chamber 100 through the first outlet main line OML1 at a first discharging mass flow in such a way that the inner pressure of the process chamber 100 may reduce down to the intermediate pressure from the second pressure. A second outlet valve 520 may be installed to the second outlet main line OML2, and the process mixture may be discharged from the process chamber at a second discharging mass flow greater than the first discharging mass flow in such a way that the inner pressure of the process chamber 100 may reduce down to the atmospheric pressure from the intermediate pressure. The first and the second outlet valves 510 and 520 may be operated complementary with, e.g., in complement with, each other.

The supercritical mixture may be fully discharged from the process chamber 100 by two steps in a medium of the intermediate pressure, the second pressure above the supercritical pressure may be dropped to the atmospheric pressure via the intermediate pressure instead of the direct drop from the second pressure to the atmospheric pressure, and the ice particles, which may be formed due to, for example, the adiabatic expansion of the supercritical mixture, which may be caused by the rapid drop of the inner pressure of the process chamber 100, may be prevented.

The supercritical mixture may be relatively slowly discharged from the process chamber 100 at the first discharging mass flow at the initial time of a discharging mode, and the inner pressure may slowly reduce down to the intermediate pressure from the second pressure. Thus, the adiabatic expansion of the supercritical mixture may be minimized, which may prohibit the condensation of the ice particles in the process chamber 100.

Thereafter, the inner pressure of the process chamber 100 may reach down to the intermediate pressure under the supercritical pressure and the supercritical mixture may be changed into the process mixture, and the third controller 440 may control the first outlet valve 510 to close and the second outlet valve 520 to open. The process mixture may be rapidly and fully discharged from the process chamber at the second discharging mass flow and the inner pressure of the process chamber 100 may reduce to the atmospheric pressure from the intermediate pressure for a relatively short time. Therefore, the rapid discharge of the process mixture through the second outlet valve 520 may compensate for the time loss of the slow discharge of the supercritical mixture through the first outlet valve 510.

For example, the intermediate pressure may be selected as a pressure close to the supercritical pressure, and the time loss of the slow discharge may be minimized while the ice particles may also minimized in the process chamber 100.

In the present example embodiment, the second pressure may be in a range of about 80 bar to about 100 bar and the intermediate pressure may be in a range of about 60 bar to about 80 bar. The first discharging mass flow of the first outlet valve 510 may be in a range of about 40 g/min to about 150 g/min and the second discharging mass flow of the second outlet valve 520 may have no limits. The process mixture may be discharged at a maximal mass flow of the second outlet valve 520.

The first outlet valve 510 may include a pneumatic control valve of which the mass flow is controlled by an air pressure and the second outlet valve 520 may include an on-off valve by which no mass flow is controlled.

The pressure drop module 300 may be provided with the first outlet main line OML1 and the supercritical mixture that may be partially removed from the process chamber 100 may be discharged outwards through the first outlet valve 510.

The supercritical mixture may be slowly discharged outwards, and the inner pressure of the process chamber 100 may slowly reduce to the second pressure from the first pressure. The rapid pressure drop from the first pressure to the second pressure may be prevented in the process chamber 100, and the ice particles may also be minimized at the pressure drop mode. The supercritical mixture may be partially removed from the process chamber 100, and the slow discharge of the supercritical mixture at the pressure drop mode may have no substantial effect on a total discharge efficiency of the supercritical mixture.

The process mixture may be discharged from the process chamber 100 through the second outlet main line OML2 and may be supplied to the recycling module 600. A pressure of the pressure mixture may be smaller than a recycling pressure in the recycling module 600, and the process mixture may be drained by the third outlet valve 530 to a drain. The process mixture gathered in the drain may be thrown out outwards.

The supercritical mixture may be gradually discharged from the process chamber 100 via the intermediate pressure, and the inner pressure may be gradually dropped step by step in the process chamber 100. The ice particles, which may be formed due to, for example, the adiabatic expansion of the supercritical mixture, which may be caused by the rapid pressure drop, may be minimized in the process chamber, and process defects, which may be caused by, for example, the ice particles, may be sufficiently prevented in the treating process.

While the present example embodiment discloses a single intermediate pressure using the first outlet valve 521, an additional intermediate pressure may also be set between the second pressure and the intermediate pressure just by installing an additional outlet valve between the first and the second outlet main lines OML1 and OML2. The discharge of the supercritical mixture may be closer to a steady state due to, for example, the additional intermediate pressure, and the rapid pressure drop in the process chamber 100 may be minimized.

The process mixture may be discharged from the process chamber 100 through the second outlet main line OML2 and may be supplied to the recycling module 600. Then, the process fluid may be separated from the process mixture and the separated process fluid may be transferred again to the supply module 200, and the recycle of the process fluid may be completed.

Figure 7:
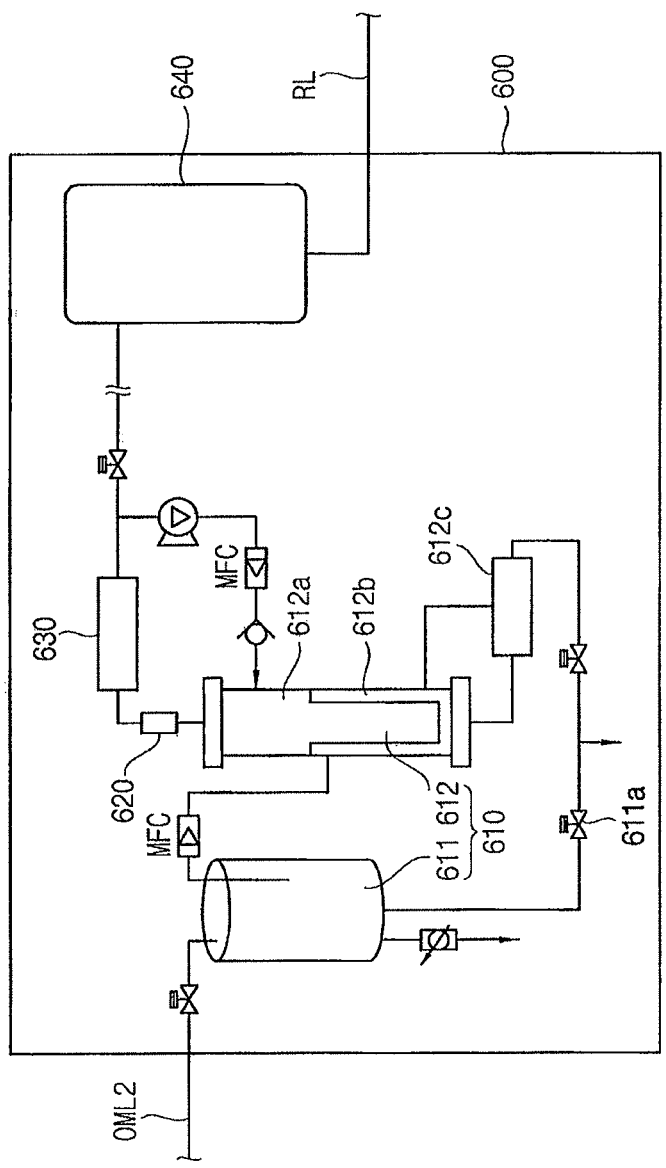
FIG. 7 illustrates a structural view of the recycling module of the substrate treating apparatus shown in FIG. 1.

FIG. 7 illustrates a structural view of the recycling module of the substrate treating apparatus shown in FIG. 1.

Referring to FIG. 7, the recycling module 600 may include a separator 610 separating the process fluid from the process mixture to thereby obtain a separated fluid, a purifier 620 removing impurities from the separated fluid to thereby obtain a recycling fluid and a recycling condenser 630 condensing the recycling fluid and a recycling reservoir 640 containing the recycling fluid.

The process fluid may flow into the separator 610 through the second outlet main line OML2 under the atmospheric pressure. The chemicals and the process fluid of the process mixture may be separated from each other in the separator 610, and the separated fluid may be formed.

For example, the separator 610 may include a phase separator 611 in which the chemicals may be removed from the process mixture by a phase difference, and the process fluid may remain, e.g., be left, to thereby obtain the separated fluid and an evaporator 612 heating the separated fluid to thereby remove residuals of the chemicals from the separated fluid.

The chemicals may be in a liquid state while the process fluid may be in a gaseous state at a room temperature under the atmospheric pressure, and the process mixture may include the gaseous process fluid and the liquid chemicals while flowing through the second outlet main line OML2. A check valve may be further provided with the second outlet main line OML2 adjacent to the phase separator 611, and the process mixture may be prevented from reversely flowing through the second outlet main line OML2 toward the discharging module 500.

The inner temperature of the phase separator 611 may be over a boiling point of the process fluid and be under a boiling point of the chemicals, and the chemicals may be in a liquid state while the process fluid may be in a gaseous state in the phase separator 611, and the chemicals and the process fluid may be separated from each other by the phase difference. For example, the phase separator 611 may be at a temperature of about 0° C. to about 50° C.

The chemicals separated in the phase separator 611 may be discharged of the phase separator 611 through a drain nozzle 611*a*, which may be arranged at a lower portion of the phase separator 611, and may be gathered in a chemical drain. The gaseous process fluid may be discharged from the phase separator 611 at an upper portion thereof as the separated fluid. Then, the separated fluid may be supplied into the evaporator 612.

The evaporator 612 may include a cylindrical body 612*a*, a distiller 612*b* that may be arranged in the cylindrical body 612*a* and remove the residual chemicals from the separated fluid and a heater 612*c* heating the distiller 612*b*.

The distiller 612*b* may be arranged into a U-shaped tube along a bottom and a sidewall of the cylindrical body 611*a* and the separated fluid may be supplied into the distiller 612b from the phase separator 611. The distiller 612b may be heated by the heater 612c to a temperature that may be over the boiling point of the process fluid and may be below the boiling point of the chemicals or other impurities. The process fluid may be evaporated and may be discharged from an upper portion of the cylindrical body 612a, while the residual chemicals or other impurities in the separated fluid may be maintained as the liquid in the distiller 612b. The residual chemicals or other impurities remaining at a lower portion of the cylindrical body 612a may be discharged from a lower portion of the body 612a.

The temperature of the distiller 612b may be varied according to the chemicals and the impurities in the separated fluid, and the impurities and the chemicals may be sequentially separated from the separated fluid by the fractional distillation.

In the present example embodiment, the phase separator 611, the evaporator 612 and the discharge module 500 may be connected with one another by one to one. In an embodiment, the phase separator 611, the evaporator 612 and the discharge module 500 may be structured into various configurations according to the requirements of the substrate treating apparatus 1000.

For example, a plurality of the phase separator 611 may be connected to a plurality of the discharge modules 500 by one to one, and then a single evaporator 612 may be connected to all of the phase separators 611. A single phase separator 611 may be connected to a plurality of the discharge module 500 and a single evaporator 612 may be connected to a single separator 611.

The separated fluid may be supplied to the purifier 620 and then the moistures and organic impurities may be removed from the separated fluid in the purifier 620, to thereby obtain the recycled fluid.

Figure 8:
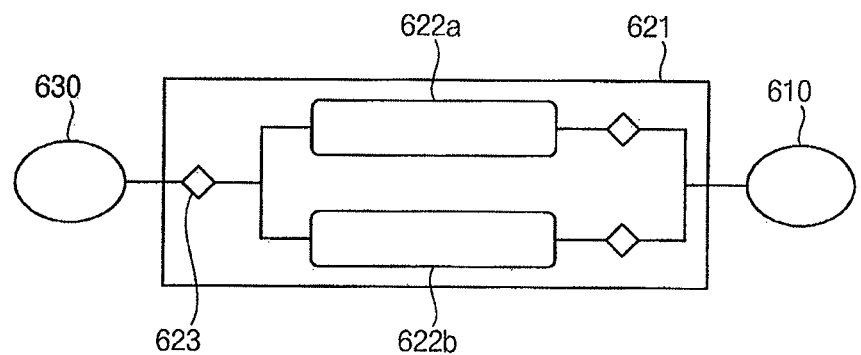
FIG. 8 illustrates a structural view of the purifier of the recycling module 600 shown in FIG. 7.

FIG. 8 illustrates a structural view of the purifier of the recycling module 600 shown in FIG. 7.

Referring to FIG. 8, the purifier 620 may include a cylindrical body 621 and a pair of adsorbents 622a and 622b in the cylindrical body 621. The adsorbents 622a ad 622b may include a plurality of adsorbent particles having fine pores and may be detachably installed to the cylindrical body 621. For example, the adsorbents 622a and 622b may include a ceramic such as aluminum silicate and a zeolite.

A concentration meter 623 such as a photo ionization detector may be arranged at front and rear portions of the adsorbents 622a and 622b, respectively, and the impurity concentration of the separated fluid may be detected prior to the purification by the adsorbents 622a and 622b and posterior to the purification by the adsorbents 622a and 622b, respectively, and then the prior concentration and the posterior concentration may be compared with each other. The adsorbent failures may be detected from the comparison results of the prior concentration and the posterior concentration.

The pair of the adsorbents 622a and 622b may be operated complementary with, e.g., in complement with, each other, and the separated fluid may be selectively supplied into one of the adsorbents 622a and 622b in the purifier 620. The separated fluid may be supplied to the first adsorbent 622a and may be purified into a first recycled fluid, and the separated fluid may be supplied to the second adsorbent 622b and may be purified into as a second recycled fluid. For example, posterior concentration of the first recycled fluid may be higher than that of the second recycled fluid, and the separated fluid may be controlled to supply into the second adsorbent 622b. The first adsorbent 622a may be repaired or replaced with new adsorbent while the separated fluid may be still be purified by the second adsorbent 622b. The purifier 620 may be repaired or replaced without halts, e.g., stoppage, of the purification therein.

The separated fluid may be sufficiently and efficiently purified by the purifier 620 before supplying again into the supply module 200 as the recycled fluid. The purity degree of the recycled fluid may be varied according to the requirements of the apparatus 1000.

The recycled fluid may be condensed and liquefied by the recycling condenser and supplied to the recycling reservoir 640. The recycled fluid in a liquid state may still include impurities, and the recycled fluid may be allowed to feedback into the evaporator 612.

The recycled fluid in the recycling reservoir 640 may be supplied to the source condenser 243 of the source supply unit 240 through a recycling line RL, the process fluid that may be supplied initially from the source reservoir 230 may be recycled after the supercritical process in the process chamber 100, and the process cost for treating the substrate W may be reduced.

The supercritical reservoir 210, the source reservoir 230 and the recycling module 600 by a process controller PC and the process controller PC may be connected to the flow controller 400. The supply of the process fluid, the supercritical process in the process chamber 100, the discharge of the supercritical mixture from the process chamber 100 and the recycling of the process fluid may be systematically controlled by the process controller PC and the flow controller 400 in the apparatus 1000, and the efficiency of the substrate treating process may be optimized.

According to example embodiments of the substrate treating apparatus, the pressure drop mode and the supplemental mode may be alternately repeated in the supercritical process, and the efficiency of the substrate treating process in the process chamber may be increased. The supercritical mixture of the supercritical process may be gradually discharged from the process chamber step by step through a plurality of outlet valves having different mass flows, and the ice particles, which may be formed due to, for example, an adiabatic expansion of the supercritical mixture, which may be caused by a rapid pressure drop in the process chamber, may be minimized.

Figure 9:
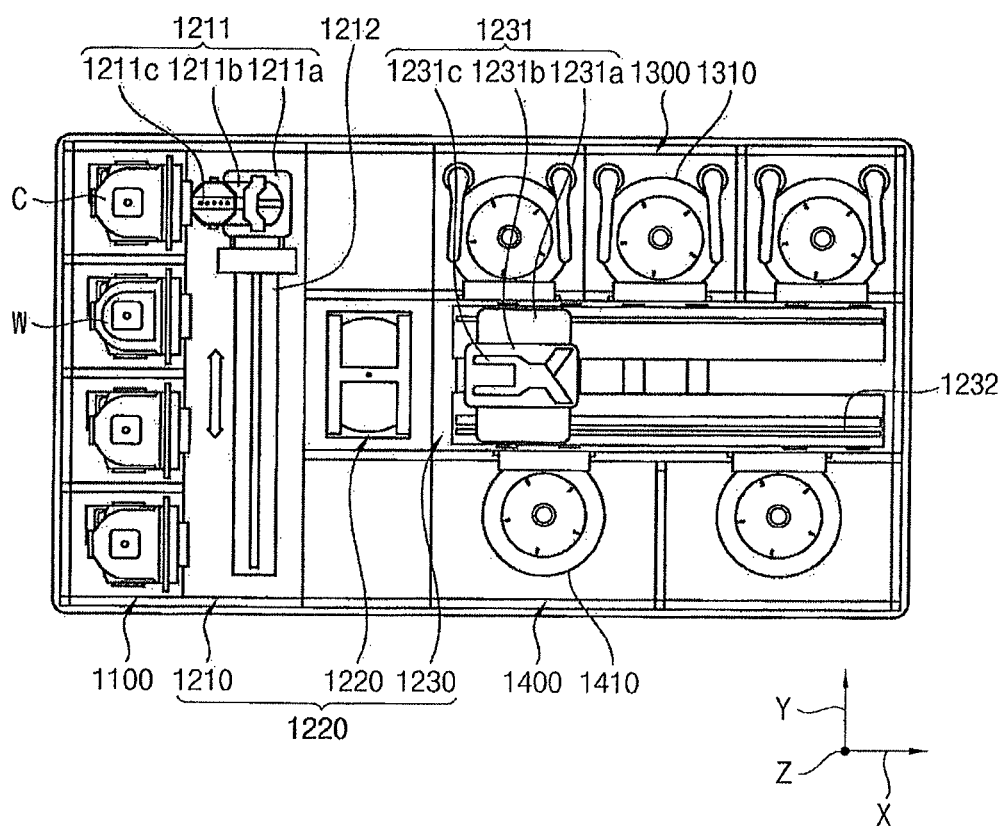
FIG. 9 illustrates a structural view of a substrate treatment system including the substrate treating apparatus shown in FIG. 1.

FIG. 9 illustrates a structural view of a substrate treatment system including the substrate treating apparatus shown in FIG. 1.

Referring to FIG. 9, a substrate treatment system 2000 in accordance with an example embodiment may include a load port 1100 to which a substrate carrier C may be positioned, a plurality of treating apparatuses 1300 and 1400 in which at least one of the substrates W may be treated and a transfer 1200 extracting the substrate W from the carrier C and loading the substrate W into one of the treating apparatuses 1300 and 1400. The carrier C may hold a plurality of substrates W that may be treated in the apparatuses 1300 and 1400 along a sequence of subsequent processes. At least one of the treating apparatuses 1300 and 1400 may include the substrate treating apparatus 1000 that may be described in detail with reference to FIGS. 1 to 8.

A plurality of the substrate W may be stacked in the carrier C and may be transferred toward the load port 1100. The transfer 1200 may extract the substrate from the load port 1100 according to a substrate treatment routine and then may load the extracted substrate into one of the apparatuses 1300 and 1400.

The load port 1100, the transfer 1200 and the apparatuses 1300 and 1400 may be arranged in an order of the substrate treatment routine in the system 2000. In the present example embodiment, the load port 1100 and the transfer 1200 may be arranged in a line and the apparatuses 1300 and 1400 may be arranged at both lateral sides of the transfer 1200. The layout of the system 2000 may be varied according to the efficiency of the substrate treatment process in the system 2000.

The load port 1100 may be located at a boundary area between the system 2000 and the surroundings and may provide a standby area in which the substrate W may be loaded into the system 2000 or may be unloaded from the system 2000.

A plurality of the substrate W may be contained in the carrier C and the carrier C may be loaded onto the load port 1100 or may be unloaded from the load port 1100. For example, the carrier C may be transferred between neighboring substrate treatment systems 2000 by an inter-system transfer such as an overhead hoist transfer (MIT), an automatic guided vehicle and a rail guided vehicle. A front opening unified pod (FOUP) may be used as the carrier C.

The transfer 1200 may include an index frame 1210, a buffer chamber 1220 and a transfer chamber 1230.

The index frame 1210 may include an index robot 1211 and an index rail 1212 and may extract one of the substrates W from the carrier C according to the substrate treatment routine.

The index robot 1211 may extract the substrate W from the carrier C and may slide along the index rail 1212. Then, the substrate W may be transferred to the buffer chamber 1220.

The index robot 1211 may include a base 1211*a*, a body 1211*b* and a robot arm 1211*c*. The base 1211*a* may be arranged on the index rail 1212, and may move along the index rail 1212. The body 1211*b* may be combined to the base 1211*a* in such a way that the body may vertically move in a third direction z or may be rotated with respect to the third direction z. The robot arm 1211*c* may be combined to the body 1211*b* and may move forward or backward. A hand may be installed to an end portion of the robot arm 1211*c* and the substrate W may be picked up by the hand.

The index rail 1212 may be omitted if necessary in such a configuration that the index robot 1211 may be combined to the index frame 1210. The index robot 1211 may be positioned at a central portion of the index frame 1210 and the extracted substrate W may be transferred to the buffer chamber 1220 by the robot arm 1211*c*.

The buffer chamber 1220 and the transfer chamber 1230 may be arranged in a line along a first direction x and the apparatuses 1300 and 1400 may be arranged at both sides of the transfer chamber 1230.

The buffer chamber 1220 may be interposed between the index fame 1210 and the transfer chamber 1230 and may include a buffer space in which the extracted substrate W may be temporarily stored. A plurality of buffer slots may be provided with the buffer chamber 1220 and a single substrate W may be arranged on each buffer slot. A to-be-processed substrate W that may be extracted from the carrier C by the index robot 1231 or a processed substrate W that may be unloaded from the apparatuses by the transfer robot 1231 may be stored in the buffer chamber 1220.

The apparatuses 1300 and 1400 may be laterally arranged at both sides of the transfer chamber 1230 and the buffer chamber 1220 may be arranged at an end portion of the transfer chamber 1230.

A transfer robot 1231 and a transfer rail 1232 may be arranged in the transfer chamber 1230. The transfer robot 1231 may include a base 1231*a*, a body 1231*b* and a robot arm 1231*c*. The base 1231*a* of the transfer robot 1231 may move along the transfer rail 1232 and the substrate W may be transferred from the buffer chamber 1220 and be loaded or unloaded into or from the apparatuses 1300 and 1400 by the operation of the body 1231*b* and robot arm 1231*c*. The transfer rail may provide a moving path for the transfer robot 1231 and may extend in the first direction x in the transfer chamber 1230.

Various process chambers may be provided with the apparatuses 1300 and 1400 according to the configurations and the requirements of the system 2000. In the present example embodiment, a first apparatus 1300 may be arranged at a first side of the transfer chamber 1230 and a second apparatus 1400 may be arranged at a second side opposite to the first side of the transfer chamber 1230.

The first apparatus 1300 may include a single process chamber and a plurality of the process chambers that may be arranged in a line along the first direction x. Some of the process chambers may include a stack chamber in which a plurality of the process chambers may be stacked in the third direction z. In the same way, the second apparatus 1400 may include a single process chamber and a plurality of the process chambers that may be arranged in a line along the first direction x. Some of the process chambers may also include a stack chamber in which a plurality of the process chambers may be stacked in the third direction z. In a modified example embodiment, both of the first and the second apparatuses 1300 and 1400 may be laterally arranged at a single side of the transfer chamber 1230 or the second apparatus 1400 may be stacked on the first apparatus 1300.

A single process may be sequentially performed through the first and the second apparatuses 1300 and 1400, or a plurality of processes may be individually performed in each of the apparatuses 1300 and 1400. For example, a wet etching process, a cleaning process, and a first drying process may be performed in the first apparatus 1300 and a second drying process may be performed in the second apparatus 1400. Otherwise, one of the first and the second drying processes may be performed according to the process requirements.

The first drying process may include a wet drying process using an organic solvent and the second drying process may include a supercritical process using a supercritical fluid. The second drying process may be performed in the substrate treating apparatus 1000 shown in FIGS. 1 to 8.

The second apparatus 1400 may include a process chamber 100 configured to treat the substrates using a supercritical fluid, a supply module 200 that may supply the supercritical fluid into the process chamber 100 and may have an inlet valve 221 through which the supercritical fluid flows into the process chamber 100 until an inner pressure of the process chamber 100 may reach a first pressure and a turbulent flow generator 222 supplementing the supercritical fluid in a turbulent state into the process chamber 100 until the inner pressure of the process chamber 100 may be recovered to the first pressure, and a pressure drop module 300 that may drop the inner pressure of the process chamber 100 to a second pressure from the first pressure by partially removing a supercritical mixture of the supercritical fluid and chemicals from the process chamber 100 until the inner pressure of the process chamber 100 may be dropped to the second pressure from the first pressure.

The pressure drop mode in which the supercritical mixture may partially flow out from the process chamber when the inner pressure reaches the first pressure and the supplemental mode in which the supercritical fluid turbulently flows into the process chamber when the inner pressure reaches the second pressure may be alternately repeated by the flow controller 400, and the chemicals may be efficiently separated from the substrate and the substrate W may be sufficiently dried for a short time. The supercritical mixture may be gradually discharged from the process chamber 100, and the ice particles, which may be formed due to, for example, the adiabatic expansion of the supercritical mixture when discharging from the process chamber 100, may be minimized.

Further, the first apparatus 1300 may also include the substrate treating apparatus 1000 shown in FIGS. 1 to 8, and the wet etching process and the cleaning process may also be performed by using the supercritical fluid.

The apparatuses 1300 and 1400 for the supercritical process may have substantially the same structures as the substrate treating apparatus 1000, and further detailed descriptions on the apparatuses 1300 and 1400 for the supercritical process will be omitted.

According to example embodiments of the substrate treatment system 2000, the pressure drop mode and the supplemental mode may be alternately repeated in the supercritical process, and the efficiency of the substrate treating process in the process chamber may be increased. The supercritical mixture of the supercritical process may be gradually discharged from the process chamber step by step through a plurality of outlet valves having different mass flows, and the ice particles, which may be formed due to, for example, an adiabatic expansion of the supercritical mixture, which may be caused by a rapid pressure drop in the process chamber, may be minimized.

Hereinafter, a method of treating substrates may be described in detail in the substrate treating apparatus shown in FIGS. 1 to 8.

Figure 10:
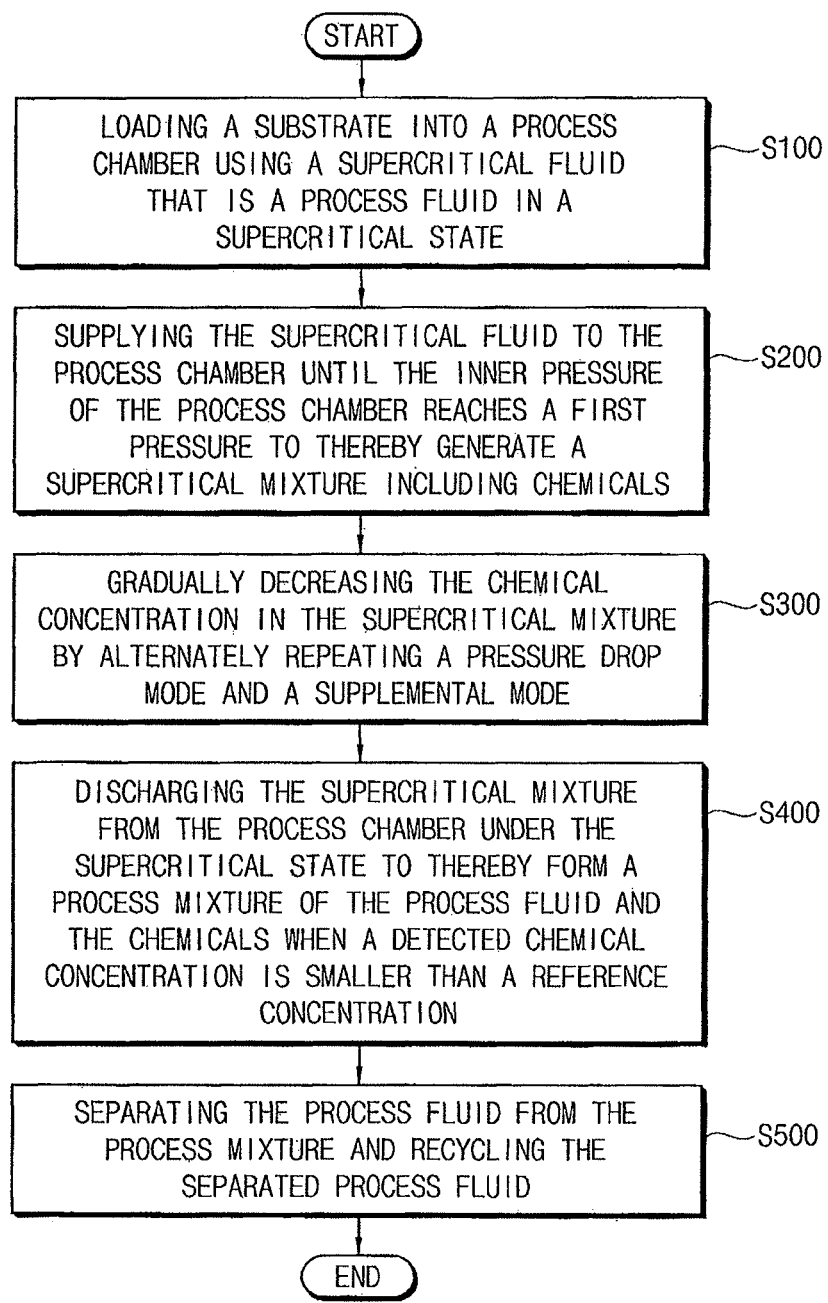
FIG. 10 illustrates a flow chart of processing operations for a method of treating substrates in the substrate treating apparatus shown in FIGS. 1 to 8.

FIG. 10 illustrates a flow chart of processing operations for a method of treating substrates in the substrate treating apparatus shown in FIGS. 1 to 8. In FIG. 10, a supercritical dry process, e.g., drying process, against a substrate that has undergone a wet process may be exemplarily disclosed as the method of treating the substrate. In an embodiment, the present supercritical process may also be applied to other processes such as a cleaning process to an etched substrate.

Referring to FIGS. 1 to 8 and 10, the substrate W may be loaded into the process chamber 100 in which the supercritical process may be performed by using the supercritical fluid (operation S100).

For example, fine pattern structures having a high aspect ratio of about 10 to about 50 may be formed on the substrate W and the wet processes such as a wet etch process and a wet cleaning process may be performed in previous manufacturing operations.

The fine pattern structures may include a multilayer structure that may be formed on the substrate such as a wafer by an etching process, and a cleaning process and a rinse process for removing byproducts and residuals of the etching process may be performed on the substrate W.

For example, the substrate W may be cleaned by a cleaning solution including a de-ionized water, an aqueous hydrofluoric solution, a buffered oxide etchant (BOE), an ammonia solution, peroxide and isopropyl alcohol and may be rinsed by using organic chemicals that may have high solubility with respect to the supercritical fluid.

For examples, the organic chemicals for the rinsing process may include ethyl glycol, propanol, tetra hydraulic franc, 4-hydroxyl, 4-methyl, 2-pentanone, 1-butanol, 2-butanol, methanol, ethanol, n-propyl alcohol, dimethylether and combinations thereof. The process fluid for removing the organic chemicals from the substrate W in the forming the supercritical state may include carbon dioxide ($CO_2$), pure water ($H_2O$), methane ($CH_4$), ethane ($C_2H_6$), propane ($C_3H_8$), ethylene ($C_2H_4$), propylene ($C_2H_2$), methanol ($C_2H_3OH$), ethanol ($C_2H_5OH$), sulfur hexafluoride ($SF_6$), acetone ($C_3H_8O$) and combinations thereof.

In the present example embodiment, carbon dioxide ($CO_2$) may be used as the process fluid and isopropyl alcohol (IPA) may be used as the organic chemicals.

Figure 11:
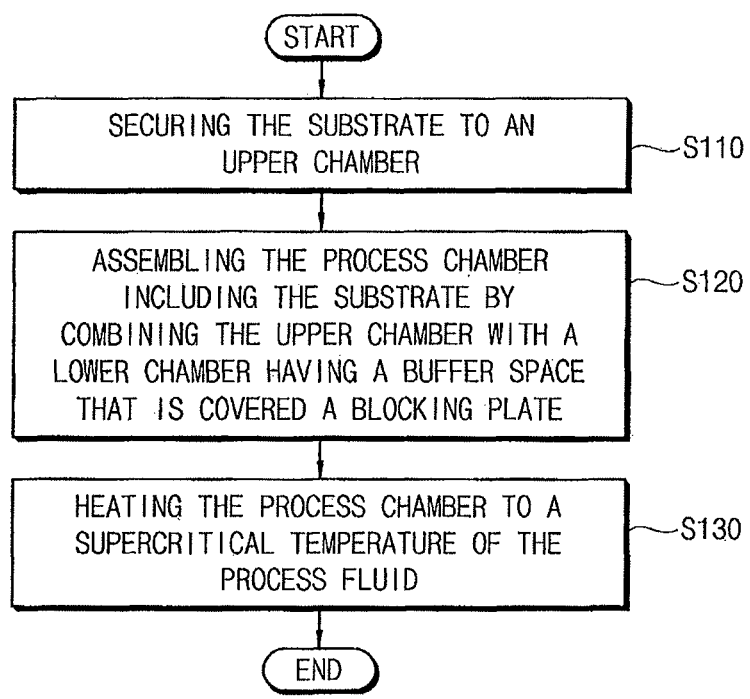
FIG. 11 illustrates a flow chart of the processing operation of loading the substrate into the process chamber shown in FIG. 10.

FIG. 11 illustrates a flow chart of the processing operation of loading the substrate into the process chamber shown in FIG. 10.

Referring to FIG. 11, the substrate W may be secured to the substrate holder 112 of the upper chamber 110 (operation S110).

For example, the substrate W may be secured to the substrate holder 112 in such a way that the rear surface of the substrate W may make contact with the horizontal bar 112a the edge of the substrate W may make contact with the vertical bar 112b. The fine pattern structures may face the ceiling 111a of the upper chamber 110 such that the substrate W may be spaced apart from the ceiling 111a, and the process space PS may be provided between the substrate W and the upper portion of the upper chamber 110. The substrate W may be loaded onto the substrate holder 112 by a substrate transfer such as a robot arm.

Then, the lower chamber 120 having a buffer space BS that may be covered by a blocking plate 122 may be combined to the upper chamber 110, and the process chamber 100 having the inner space S that may be isolated from surroundings may be assembled (operation S120).

For example, the hydraulic cylinder 131 of the chamber driver 130 may drive the lower chamber 120 to move upwards until the joints 124 may penetrate through the upper body 111. The sealing member 125 around the joint 124 may sufficiently seal the inside of the upper and the lower chambers 110 and 120 from surroundings, and the inner space S of the process chamber 100 may be sealed from surroundings.

For example, the lower chamber 120 may be combined to the upper chamber 110 by a hydraulic force of about 260 bar to about 300 bar, and the process chamber 100 may have an allowable pressure of about 300 bar.

Then, the process chamber 100 may be heated to an inner temperature above the supercritical temperature of the process fluid (operation S130).

The upper heaters 113 and the lower heaters 123 may heat the upper chamber 110 and the lower chamber 120, respectively, to the inner temperature above the supercritical temperature. For example, the inner temperature of the process chamber 100 may be set in a range of about 40° C. to about 100° C.

The substrate W may be secured to the substrate holder 112 in the process chamber 100b, and the supercritical fluid may be supplied to the process chamber 100 until the inner pressure of the process chamber 100 may reach the first pressure (operation S200).

The process fluid in the source reservoir 230 may be supplied into the supercritical reservoir 210 and then the supercritical reservoir may be heated to the supercritical temperature under the supercritical pressure of the process fluid, and the process fluid may be transformed into the supercritical fluid. Then, the supercritical fluid SCF may be supplied to the buffer space BS of the lower chamber 120 through the lower line SCL2 under control of the lower valve 221b.

The blocking plate 122 may be arranged over the buffer space BS, and the supercritical fluid SCF may be prevented from direct injection to the substrate W, and the high aspect ratio pattern structure on the substrate W may be sufficiently protected from the supercritical fluid. The ice particles, which may be caused, e.g., formed, by the adiabatic expansion of the supercritical fluid, may be settled down just in the buffer space BS, and the process defects, which may be caused by the ice particles in the supercritical process, may be minimized.

The inner pressure of the process chamber 100 may increase due to, for example, the supply of the supercritical fluid, and the pressure gradient between the inner pressure of the process chamber 100 and the pressure of the supercritical fluid may decrease. The risk of the pattern collapse due to, for example, the direct injection of the supercritical fluid, may decrease as the supercritical fluid may be supplied into the process chamber. The process defects, which may be caused by the ice particles, may also decrease as the supercritical fluid may be supplied into the process chamber 100.

For that reason, the supercritical fluid SCF may be supplied to the process space PS of the upper chamber 110 through the upper line SCL 1 under the control of the upper valve 221a, the supercritical fluid SCF may be supplied into the process chamber 100 through both of the upper line SCL1 and the lower line SCL2, and the supply time of the supercritical fluid may be reduced. The supercritical fluid SCF may be supplied until the inner pressure of the process chamber 100 may reach the first pressure above the supercritical pressure of the process fluid.

For example, the mass flow of the supercritical fluid may be controlled by the upper and lower valves 221a and 221b in a range of about 50 g/min to about 200 g/min. For example, the supercritical fluid may be supplied into the buffer space at a relatively small mass flow so as to minimize the ice particles and reduce the impact to the blocking plate 122 by the supercritical fluid. In contrast, the supercritical fluid may be supplied into the process space PS at a relatively large mass flow so as to increase the supply efficiency of the supercritical fluid.

In the present example embodiment, the supercritical fluid may be supplied into the buffer space BS at a mass flow of about 50 g/min to about 200 g/min, while supplied into the process space PS at a mass flow of about 200 g/min to about 400 g/min. The mass flow of the supercritical fluid may be varied according to the configurations of the apparatus 1000 and the characteristics of the supercritical process.

The process chamber 100 may be under the supercritical state under the first pressure above the supercritical pressure.

Figure 12:
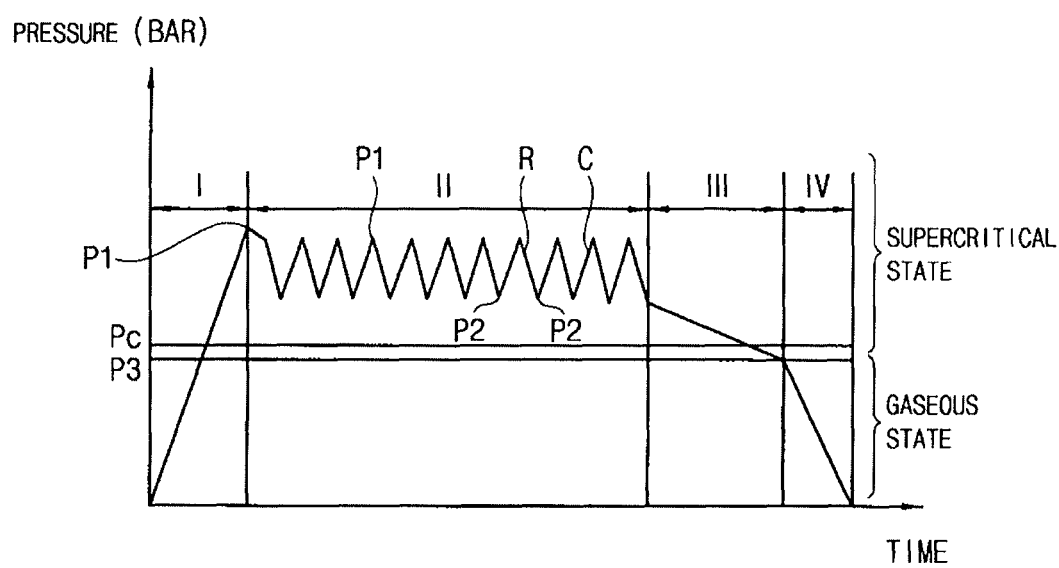
FIG. 12 illustrates a graph of the pressure variation in the supercritical process in the process chamber of the apparatus shown in FIG. 1.

FIG. 12 illustrates a graph of the pressure variation in the supercritical process in the process chamber of the apparatus shown in FIG. 1.

Referring to FIG. 12, the supercritical process may be performed through an initial supply stage I in which the supercritical fluid SCF may be supplied into the process chamber 100, a solvent substitution stage II in which the chemicals may be removed from the substrate W by the solvent substitution, a slow discharge stage III in which the supercritical mixture may be slowly discharged from the process chamber and a rapid discharge stage IV in which the supercritical mixture may be rapidly discharged from the process chamber. The inner pressure of the process chamber may be varied according to each of the stages I to IV.

At first, the inner pressure of the process chamber 100 may be under the supercritical pressure Pc, the inner space S of the process chamber 100 may not be under the supercritical state, no supercritical process may be conducted in the process chamber 100, and no chemicals may be separated from the substrate W. The supercritical drying process may not be performed in the process chamber 100.

The supercritical fluid may be continuously supplied to the process chamber 100, the inner pressure may be over the supercritical pressure Pc, the inner space S of the process chamber 100 may be under the supercritical state, and the chemicals may be separated from the substrate W by the solvent substitution. The chemicals may be dissolved into the supercritical fluid, and the supercritical mixture may be generated. The supercritical fluid may still be supplied into the process chamber 100 until the inner pressure may reach the first pressure P1.

The supercritical process may be performed from the time when the inner pressure may reach the supercritical pressure to the time when the inner pressure may reach the first pressure.

Then, the chemical concentration in the supercritical mixture may be gradually reduced by alternately repeating the pressure drop mode R and the supplemental mode C (operation S300). The inner pressure of the process chamber 100 may reach the first pressure P1, and the supercritical mixture may be partially removed from the process chamber 100 by the pressure drop module 300 until the inner pressure may be reduced down to the second pressure P2 (pressure drop mode R). The inner pressure of the process chamber 100 may reach the second pressure P2, and the supercritical fluid may be turbulently supplemented into the process chamber 100 by the turbulent flow generator 220 until the inner pressure may be recovered to the first pressure P1 (supplemental mode C).

The supercritical mixture may be removed from the process chamber 100 at every pressure drop mode R and the supercritical fluid may be supplemented into the process chamber 100 at every supplemental mode C, and the chemical concentration of the supercritical mixture may be gradually decreased in the process chamber 100 as the pressure drop mode R and supplemental mode C may be repeated. For example, the supercritical fluid may be turbulently supplied into the process chamber 100, and the turbulent flow may be generated in the process space PS whenever the supplemental mode may be conducted. The turbulent flow of the supercritical fluid may increase the reaction rate of the solvent substitution, and the removal efficiency of the chemicals from the substrate W may be increased.

Figure 13:
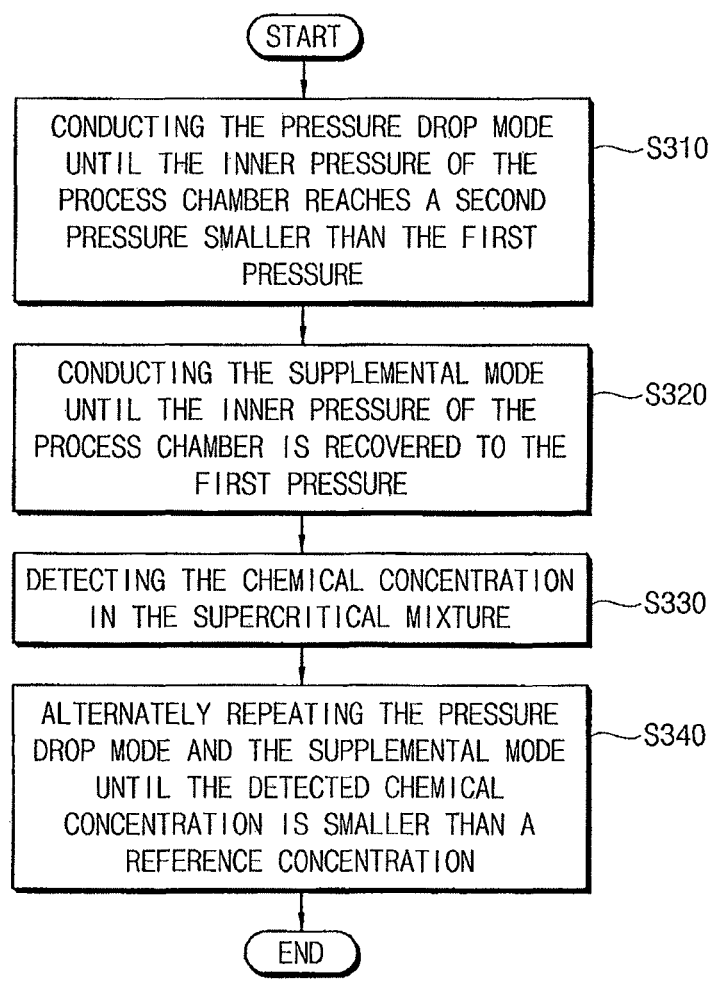
FIG. 13 illustrates a flow chart of the process operation of decreasing the chemical concentration in the supercritical mixture shown in FIG. 10.

FIG. 13 illustrates a flow chart of the process operation of decreasing the chemical concentration in the supercritical mixture shown in FIG. 10.

Referring to FIGS. 12 and 13, the inner pressure of the process chamber may reach the first pressure P1, the first controller 420 may control the inlet valve 221 to be closed and the second controller 430 may control the pressure drop module 300 to activate, and the supercritical fluid may be stopped supplying into the process chamber 100 and the supercritical mixture may be partially removed from the process chamber 100 until the inner pressure may reach the second pressure P2. The pressure drop mode R may be conducted until the inner pressure of the process chamber 100 may reach the second pressure P2 (operation S310).

The inner temperature and pressure of the process chamber 100 and the concentration of the chemicals in the supercritical mixture may be periodically detected by the chamber detector 410 and may be transferred to the central controller 450.

The inner pressure may reach the second pressure P2 in the process chamber, the first controller 420 may control the inlet valve 221 to be still closed and the turbulent flow generator 222 to activate while the second controller 430 may control the pressure drop module 300 to inactivate, and the supercritical mixture may be stopped partially flowing out from the process chamber 100 and the supercritical fluid may be turbulently supplemented into the process space PS of the process chamber 100 through the branch line SCBL until the inner pressure may be recovered the first pressure P1. The supplemental mode C may be conducted until the inner pressure of the process chamber 100 may be recovered the first pressure P1 (operation S320).

For example, the turbulent flow generator 222 may include a pneumatic control valve and may supplement the supercritical fluid at a mass flow of about 800 g/min to about 1200 g/min.

In the present example embodiment, the first pressures P1 may be set in a range of about 80 bar to about 180 bar and the second pressure P2 may be set in a range of about 80 bar to about 100 bar, while the supercritical pressure Pc may be determined to about 73 bar corresponding to the supercritical pressure of carbon dioxide ($CO_2$). The first and second pressures P1 and P2 may still be over the supercritical pressure of the process fluid, and the solvent substitution may be conducted irrespective of the first and the second pressures P1 and P2. The supercritical mixture may be generated irrespective of the pressure drop mode R and the supplemental mode C in the process chamber 100.

The supercritical fluid may be turbulently supplemented to the supercritical mixture, the solvent substitution may rapidly occur and the chemicals may be dissolved into the supercritical fluid for a shorter time, and the efficiency of the supercritical drying process may be increased.

The chemical concentration in the supercritical mixture may be detected at the pressure drop mode R (operation S330). The detected chemical concentration may be greater than the reference concentration, and the pressure drop mode R may be conducted again. The detected chemical concentration may be smaller than the reference concentration, and the supercritical mixture may be totally discharged from the process chamber 100 by the discharging module 500. The detected chemical concentration may be greater than the reference concentration, and the pressure drop mode R and the supplemental mode C may be repeated over and over again until the detected chemical concentration is smaller than the reference concentration (operation S340).

The supercritical mixture may be removed from the process chamber 100 at every pressure drop mode R and the supercritical fluid may be supplemented into the process chamber 100 at every supplemental mode C, and the chemical concentration of the supercritical mixture may be gradually decreased in the process chamber 100 as the pressure drop mode R and supplemental mode C may be repeated. The turbulent flow of the supercritical fluid may increase the reaction rate of the solvent substitution, and the removal efficiency of the chemicals from the substrate W may be increased. In the present example embodiment, the reference concentration may be in a range of about 1 wt % to about 3 wt % with respect to the weight of the chemicals.

The comparative supercritical process may include a single pressure drop mode and a single supplemental mode, the process conditions in the process chamber 100 may not be varied during the supercritical process, and the process conditions for the solvent substitution may be fixed at the initial time of the supercritical process. The process conditions of the supercritical process of presently disclosed embodiments may be varied several times whenever the pressure drop mode R and the supplemental mode C may be conducted. Therefore, the process conditions for the solvent substitution may be improved during the supercritical process, and the process efficiency of the supercritical process may be increased.

While the present example embodiment discloses that the reference concentration may be used for terminating the repetition loop of the pressure drop mode R and the supplemental mode C, various loop termination conditions may be utilized in view of the configurations of the apparatus 1000.

For example, the repetition loop of the pressure drop mode R and the supplemental mode C may be compulsorily terminated by the activation number of the supplemental mode when the counted activation number of the supplemental mode may correspond to a preset activation number. The discharging module 500 may be compulsorily operated when the pressure drop mode R and the supplemental mode C may be repeated at a preset times, and the supercritical process may be compulsorily terminated.

The detected chemical concentration may be under the reference concentration, the supercritical mixture may be totally discharged from the process chamber 100 without further pressure drop mode R (operation S400), and the supercritical process may be terminated in the process chamber 100.

Figure 14:
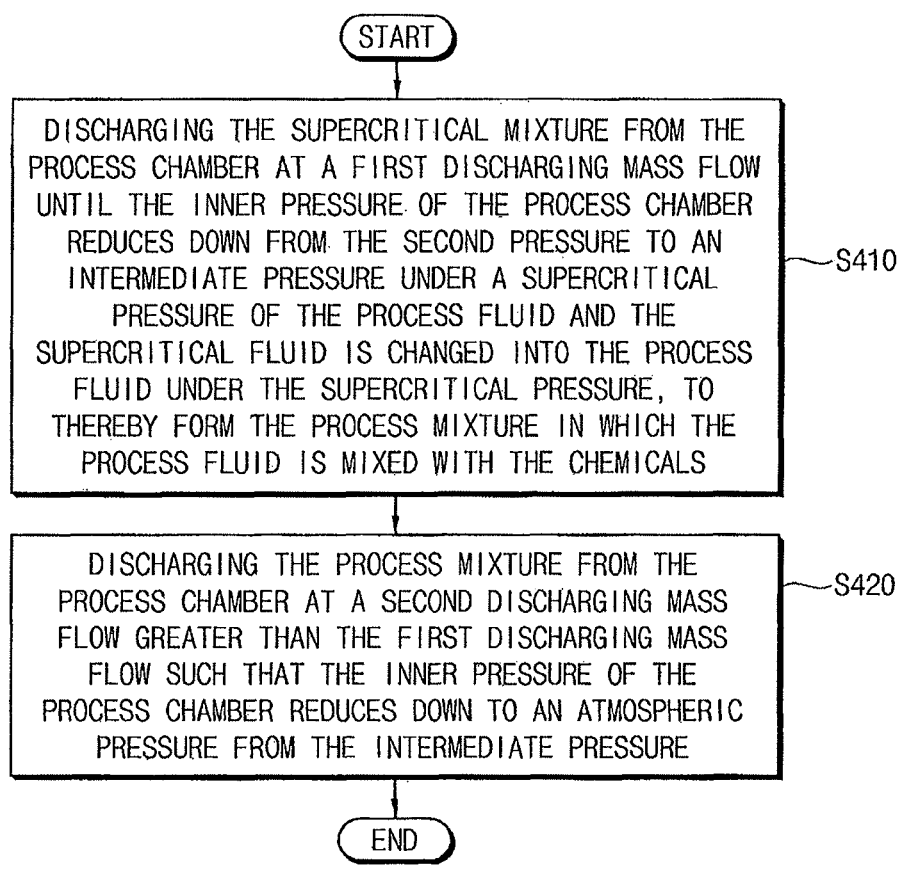
FIG. 14 illustrates a flow chart of the process operation of discharging the supercritical mixture from the process chamber.

FIG. 14 illustrates a flow chart of the process operation of discharging the supercritical mixture from the process chamber.

Referring to FIGS. 12 and 14, the supercritical mixture may be discharged through the slow discharge stage III the rapid discharge stage IV.

The detected chemical concentration may be under the reference concentration, the third controller 440 may control the first outlet valve 510 to be open and the second outlet valve 520 to close, and the supercritical mixture may be slowly discharged from the process chamber 100 at a first discharging mass flow until the inner pressure of the process chamber 100 may reduce down to the intermediate pressure P3 from the second pressure P2 (operation S410). The intermediate pressure may be below the supercritical pressure, the supercritical fluid in the process chamber 100 may be changed again into the process fluid, and the supercritical mixture may be gradually transformed into the process mixture in which the chemicals may be mixed with the process fluid.

The inner pressure of the process chamber 100 may reach the intermediate pressure P3, the third controller 440 may control the first outlet valve 510 to close and the second outlet valve 520 to open, and the supercritical mixture may be rapidly discharged from the process chamber 100 at a second discharging mass flow greater than the first discharging mass flow until the inner pressure of the process chamber 100 may reduce down to an atmospheric pressure from the intermediate pressure P3 (operation S420). Thus, the supercritical mixture may be totally discharged from the process chamber 100 and the substrate treating process may be completed. Then, the treated substrate may be unloaded from the apparatus 1000.

For example, the intermediate pressure P3 may be selected as a pressure close to the supercritical pressure Pc, and the time loss of the slow discharge may be minimized while the ice particles may also minimized in the process chamber 100 in the slow discharge stage III. In the present example embodiment, the intermediate pressure P3 may be set in a range of about 60 bar to about 80 bar, while the supercritical pressure Pc may be determined to about 73 bar corresponding to the supercritical pressure of carbon dioxide ($CO_2$).

In the present example embodiment, the outlet first valve 510 may include a pneumatic control valve of which the mass flow may be controlled by an air pressure and the second outlet valve 520 may include an on-off valve by which no mass flow may be controlled. The first discharging mass flow of the first outlet valve 510 may be in a range of about 40 g/min to about 150 g/min and the second discharging mass flow of the second outlet valve 520 may have no limits. The process mixture may be discharged at a maximal mass flow of the second outlet valve 520.

Then, the process fluid may be selectively separated from the process mixture and may be recycled in the apparatus 1000 (operation S500).

The process mixture may be discharged from the process chamber 100 through the second outlet main line OML2 and may be supplied to the recycling module 600. The process fluid such as the carbon dioxide ($CO_2$) may be under gaseous state and the organic chemicals may be under liquid state under atmospheric pressure, and the process fluid and the chemicals may be separated from each other in the process mixture by the phase difference.

The process mixture may flow into the phase separator 611 through the second outlet main line OML2 and the chemicals may be separated from the process fluid by the phase difference, and the separated fluid may be formed in the phase separator 611. Then, the separated fluid may flow into the evaporator 612 and the residual chemicals may be removed from the separated fluid, and the recycled fluid may be formed in the evaporator 612. The recycled fluid may be purified by the purifier 620, and the moistures and other impurities may be further removed from the recycled fluid. Then, the recycled fluid may be supplied into the supply module 200, and the process fluid may be recycled in the apparatus 1000.

By way of summation and review, supercritical fluid, which may behave simultaneously like a gas and like a liquid, may be used in a drying process for avoiding pattern collapses and bridge defects. The supercritical fluid may diffuse through solids similar to a gas and simultaneously may dissolve materials similar to a liquid without surface tension of the liquid, and the chemicals for a wet process may be easily diffused or dissolved in the supercritical fluid in the drying process.

However, a supercritical fluid above its critical point may cause damage to a substrate and further may cause collapse of fine patterns on the substrate due to, for example, high pressure. Rapid pressure drop in the drying process may cause an adiabatic expansion of the supercritical fluid, which may generate various defect particles in the drying process, and the yield of semiconductor devices may be deteriorated. The supercritical fluid may steadily flow in a comparative process chamber of the drying process, and the diffusion or dissolution of the chemicals together with the supercritical fluid necessarily may require a relatively large dry time.

Example embodiments may provide an apparatus for treating substrates using supercritical fluid in which the pressure of the supercritical fluid may be gradually dropped and may flow in a turbulent state in the process chamber, and defect particles may be decreased and removal efficiency of the chemicals may be increased when drying the substrates. Example embodiments may provide methods of treating the substrates in the above apparatus. Example embodiments may provide a substrate treatment system including the above apparatus.

Example embodiments relate to an apparatus and a system for treating substrates using supercritical fluids and a method of treating substrates using the supercritical fluids.

According to the example embodiments of the substrate treating apparatus and the method of treating the substrates using the same, the pressure drop mode and the supplemental mode may be alternately repeated in the supercritical process, and the efficiency of the substrate treating process in the process chamber may be increased. The supercritical mixture of the supercritical process may be gradually discharged from the process chamber step by step through a plurality of outlet valves having different mass flows, and ice particles, which may be caused due to, for example, an adiabatic expansion of the supercritical mixture, which may be caused by a rapid pressure drop in the process chamber, may be minimized.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of removing chemicals from a substrate in a process chamber under a supercritical state, comprising:
    separating the chemicals from the substrate in a supercritical fluid by a supercritical process in such a way that a supercritical mixture in which the chemicals are dissolved is generated until an inner pressure of the process chamber reaches a first pressure;
    repeating a partial removal of the supercritical mixture from the process chamber until the inner pressure reaches a second pressure smaller than the first pressure and a partial supplement of the supercritical fluid into the process chamber until the inner pressure reaches the first pressure; and
    discharging the supercritical mixture from the process chamber step by step until the inner pressure reaches down to an atmospheric pressure from the second pressure, wherein the first pressure is in a range of 100 bar to 180 bar and the second pressure is in a range of about 80 bar to 100 bar.

2. The method of claim 1, wherein the partial removal of the supercritical mixture is initiated when the inner pressure reaches the first pressure and a chemical concentration is equal to or greater than a reference concentration, and the partial supplement of the supercritical fluid is initiated when the inner pressure is the second pressure.

3. The method of claim 1, wherein the step of discharging the supercritical mixture from the process chamber includes:
    detecting a chemical concentration of the supercritical mixture in the process chamber; and
    continuously removing the supercritical mixture in place of the partial supplement of the supercritical fluid when the chemical concentration is smaller than a reference concentration.

4. The method of claim 3, wherein the reference concentration is in a range of 1 wt % to 3 wt % with respect to weight of the chemicals.

5. The method of claim 1, wherein the step of discharging the supercritical mixture from the process chamber includes:
    counting a repeated number of the partial supplement of the supercritical fluid to obtain an activation number; and
    compulsory terminating the partial supplement of the supercritical fluid into the process chamber when the activation number corresponds to a preset activation number to continuously conducting the step of removing the supercritical mixture.

6. The method of claim 1, wherein the step of discharging the supercritical mixture from the process chamber step by step includes:
relatively slowly discharging the supercritical mixture from the process chamber until the inner pressure reaches to an intermediate pressure; and
relatively rapidly discharging the supercritical mixture from the process chamber until the inner pressure reaches to an atmospheric pressure from the intermediate pressure.

7. The method of claim 6, wherein the step of the slowly discharging the supercritical mixture from the process chamber is controlled by a pneumatic control valve in which a mass flow is regulated by an air pressure and the step of the rapidly discharging the supercritical mixture from the process chamber is controlled by an on-off valve by which no mass flow is regulated.

8. The method of claim 6, wherein the step of the slowly discharging the supercritical mixture from the process chamber is initiated from the second pressure and is continuously conducted when the inner pressure reaches the intermediate pressure.

9. The method of claim 6, wherein a supercritical pressure of the supercritical fluid is about 73 bar corresponding to a supercritical pressure of carbon dioxide ($CO_2$), and the intermediate pressure is in a range of 60 bar to 70 bar.

* * * * *